United States Patent
Ueda et al.

(10) Patent No.: US 11,038,001 B2
(45) Date of Patent: Jun. 15, 2021

(54) ACTIVE MATRIX SUBSTRATE AND METHOD FOR PRODUCING SAME

(71) Applicant: Sharp Kabushiki Kaisha, Sakai (JP)

(72) Inventors: Teruyuki Ueda, Sakai (JP); Hideki Kitagawa, Sakai (JP); Tohru Daitoh, Sakai (JP); Hajime Imai, Sakai (JP); Masahiko Suzuki, Sakai (JP); Setsuji Nishimiya, Sakai (JP); Tetsuo Kikuchi, Sakai (JP); Toshikatsu Itoh, Sakai (JP); Kengo Hara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/496,969

(22) PCT Filed: Mar. 19, 2018

(86) PCT No.: PCT/JP2018/010862
§ 371 (c)(1),
(2) Date: Sep. 24, 2019

(87) PCT Pub. No.: WO2018/180723
PCT Pub. Date: Oct. 4, 2018

(65) Prior Publication Data
US 2020/0020756 A1 Jan. 16, 2020

(30) Foreign Application Priority Data
Mar. 27, 2017 (JP) .............................. JP2017-061592

(51) Int. Cl.
*H01L 21/336* (2006.01)
*H01L 29/66* (2006.01)
(Continued)

(52) U.S. Cl.
CPC .... *H01L 27/3262* (2013.01); *G02F 1/136277* (2013.01); *G02F 1/136286* (2013.01); *H01L 27/3258* (2013.01); *H01L 27/3276* (2013.01)

(58) Field of Classification Search
CPC .......................... H01L 27/3278; H01L 27/329
(Continued)

(56) References Cited

U.S. PATENT DOCUMENTS 7,575,966 B2 * 8/2009 Lai ...................... H01L 27/1225
257/72
8,003,981 B2 * 8/2011 Iwasaki ............. H01L 29/66969
257/43
(Continued)

FOREIGN PATENT DOCUMENTS

JP 2010-003910 A 1/2010
JP 2012-134475 A 7/2012
(Continued)

OTHER PUBLICATIONS

Official Communication issued in International Patent Application No. PCT/JP2018/010862, dated Jun. 12, 2018.

*Primary Examiner* — Calvin Lee
(74) *Attorney, Agent, or Firm* — Keating & Bennett, LLP

(57) ABSTRACT

An oxide semiconductor TFT (201) of an active matrix substrate includes an oxide semiconductor layer (107), an upper gate electrode (112) disposed on a part of the oxide semiconductor layer via a gate insulating layer, and a source electrode (113) and a drain electrode (114). As viewed from a normal direction of the substrate, the oxide semiconductor layer (107) includes a first portion (p1) that overlaps the upper gate electrode, and a second portion (p2) that is located between the first portion and the source contact region or drain contact region, such that the gate insulating layer does not cover the second portion. The upper gate electrode (112) has a multilayer structure including an alloy (Continued)

layer (112L) that is in contact with the gate insulating layer and a metal layer (112U) that is disposed on the alloy layer. The metal layer is made of a first metallic element M; the alloy layer is made of an alloy containing the first metallic element M; and the first metallic element M is Cu, Mo, or Cr.

9 Claims, 23 Drawing Sheets

(51) Int. Cl.
*H01L 27/32* (2006.01)
*G02F 1/1362* (2006.01)

(58) Field of Classification Search
USPC .................. 257/343; 438/157, 176, 192, 282
See application file for complete search history.

(56) References Cited

U.S. PATENT DOCUMENTS

| | | | |
|---|---|---|---|
| 8,987,048 | B2* | 3/2015 | Yamazaki ........... H01L 27/1225 438/104 |
| 2012/0138922 | A1 | 6/2012 | Yamazaki et al. |
| 2013/0320334 | A1 | 12/2013 | Yamazaki et al. |
| 2014/0286076 | A1 | 9/2014 | Aoki et al. |
| 2015/0187898 | A1 | 7/2015 | Miyairi |
| 2016/0247831 | A1 | 8/2016 | Makita et al. |
| 2017/0075155 | A1 | 3/2017 | Oikawa et al. |

FOREIGN PATENT DOCUMENTS

| | | |
|---|---|---|
| JP | 2014-007399 A | 1/2014 |
| JP | 2014-209727 A | 11/2014 |
| JP | 2015-109315 A | 6/2015 |
| JP | 2015-144251 A | 8/2015 |
| JP | 2017-054124 A | 3/2017 |
| WO | 2015/052991 A1 | 4/2015 |

* cited by examiner (a)

(b)

(a)

(b)

(a)

(b)

(c)

ACTIVE MATRIX SUBSTRATE AND METHOD FOR PRODUCING SAME

TECHNICAL FIELD

The present invention relates to an active matrix substrate, and more particularly to an active matrix substrate having oxide semiconductor TFTs.

BACKGROUND ART

An active matrix substrate which is used in liquid crystal display devices or the like has a switching element, e.g., a thin film transistor (hereinafter, "TFT"), for each pixel. As such switching elements, TFTs whose active layer is an amorphous silicon film (hereinafter "amorphous silicon TFTs") and TFTs whose active layer is a polycrystalline silicon film (hereinafter "polycrystalline silicon TFTs") are widely used.

In recent years, it has been proposed to use an oxide semiconductor, instead of an amorphous silicon or a polycrystalline silicon, as the material of an active layer of a TFT. A TFT that includes an oxide semiconductor film as an active layer is referred to as an "oxide semiconductor TFT". Patent Document 1 discloses an active matrix substrate in which an In—Ga—Zn—O based semiconductor film is used as the active layers of TFTs.

An oxide semiconductor provides a higher mobility than does an amorphous silicon. Therefore, an oxide semiconductor TFT is able to operate more rapidly than an amorphous silicon TFT. An oxide semiconductor film is formed through a simpler process than is a polycrystalline silicon film, and therefore is applicable to devices which require a large area.

Generally speaking, an active matrix substrate has a displaying region and a peripheral region. The displaying region, which includes a plurality of pixels (pixel regions) that are arranged in a matrix shape, is also referred to as an active region. The peripheral region, which is located around the displaying region, is also referred to as a frame region.

The following are provided in the displaying region: TFTs which are formed for the respective pixels; and gate bus lines, source bus lines, and pixel electrodes, which are electrically connected respectively to gate electrodes, source electrodes, and drain electrodes of the TFTs.

In the peripheral region, driving circuits for driving gate bus lines (scanning lines) and the source bus lines (signal lines) are disposed. Specifically, gate drivers for supplying gate signals (scanning signals) to the gate bus lines and source drivers for supplying source signals (display signals) to the source bus lines are disposed. Driving circuits such as the gate drivers and source drivers may be incorporated as semiconductor chips (COG (Chip On Glass) mounted), or may be monolithically (integrally) formed on the active matrix substrate. Driving circuits that are monolithically formed are referred to as "driver-monolithic circuits". A driver-monolithic circuit is usually constructed by using TFTs.

In the present specification, TFTs which are disposed as switching elements in the pixels of the displaying region will be referred to as "pixel TFTs", whereas TFTs composing the peripheral circuitry such as driving circuits will be referred to as "circuit TFTs".

Many oxide semiconductor TFTs have a bottom gate structure (e.g. Patent Document 1), but they may also have a top gate structure. For example, Patent Document 2 discloses an oxide semiconductor TFT of a top gate structure in which a gate electrode is disposed, via a gate insulating film, above an oxide semiconductor layer (i.e., opposite to the substrate). In Patent Document 2, it is proposed to pattern a gate insulating film by using gate electrodes as a mask (self-aligning process).

CITATION LIST

Patent Literature

[Patent Document 1] Japanese Laid-Open Patent Publication No. 2010-3910

[Patent Document 2] Japanese Laid-Open Patent Publication No. 2015-109315

SUMMARY OF INVENTION

Technical Problem

However, it has been found through a study by the inventors that, in an oxide semiconductor TFT having a top gate structure such as is disclosed in e.g. Patent Document 2, the current flowing between source-drain while the TFT is OFF (OFF-leak current) may increase, such that stable characteristics may not be obtained. Details thereof will be described later.

The present invention has been made in view of the above problem, and an objective thereof is to provide an active matrix substrate having oxide semiconductor TFTs that allow an OFF-leak current to be reduced.

Solution to Problem

An active matrix substrate according to an embodiment of the present invention is an active matrix substrate comprising a substrate and an oxide semiconductor TFT supported on the substrate, the oxide semiconductor TFT including: an oxide semiconductor layer that includes a channel region, and a source contact region and a drain contact region that are respectively disposed on opposite sides of the channel region; an upper gate electrode disposed on a part of the oxide semiconductor layer via a gate insulating layer; and a source electrode that is in contact with the source contact region of the oxide semiconductor layer and a drain electrode that is in contact with the drain contact region of the oxide semiconductor layer, wherein, as viewed from a normal direction of the substrate, the oxide semiconductor layer includes a first portion that overlaps the upper gate electrode and a second portion that is located between the first portion and the source contact region or drain contact region, such that the gate insulating layer does not cover the second portion; the upper gate electrode has a multilayer structure including an alloy layer that is in contact with the gate insulating layer and a metal layer that is disposed on the alloy layer; and the metal layer is made of a first metallic element M; the alloy layer is made of an alloy containing the first metallic element M; and the first metallic element M is Cu, Mo, or Cr.

The alloy may be an alloy that contains the first metallic element M as a main component.

The alloy may contain the first metallic element M and a second metallic element X; the first metallic element M may be Cu; and the second metallic element X may be Mg, Al, Ca, Mo, Mn, or Zr.

The gate insulating layer may have a thickness which is not less than 90 nm and not more than 200 nm.

At least the first portion and the second portion of the oxide semiconductor layer may contain the first metallic element M at a concentration of more than 0 atom % but not more than 0.5 atom % with respect to the oxide semiconductor.

In one embodiment, the active matrix substrate further comprises: a lower gate electrode disposed between the oxide semiconductor layer and the substrate; and a lower insulating layer disposed between the lower gate electrode and the oxide semiconductor layer, wherein, as viewed from the normal direction of the substrate, the channel region of the oxide semiconductor layer overlaps at least one of the upper gate electrode and the lower gate electrode; and, as viewed from the normal direction of the substrate, the oxide semiconductor layer has an offset region that is located between the channel region and the source contact region or drain contact region, the offset region including at least a part of the second portion.

In one embodiment, as viewed from the normal direction of the substrate, a part of the second portion of the oxide semiconductor layer overlaps the lower gate electrode.

An active matrix substrate according to another embodiment of the present invention is an active matrix substrate comprising a substrate, and an oxide semiconductor TFT and a crystalline silicon semiconductor TFT supported on the substrate, the active matrix substrate having a displaying region defined by a plurality of pixel regions arranged in a matrix shape and a peripheral region located around the displaying region, each of the plurality of pixel regions including the oxide semiconductor TFT, and the peripheral region including the crystalline silicon semiconductor TFT, the crystalline silicon semiconductor TFT including: a crystalline silicon semiconductor layer that includes a first channel region, and a first source contact region and a first drain contact region that are respectively disposed on opposite sides of the first channel region; a first gate electrode disposed on the crystalline silicon semiconductor layer via a first gate insulating layer; and a first source electrode that is in contact with the first source contact region of the crystalline silicon semiconductor layer and a first drain electrode that is in contact with the first drain contact region of the crystalline silicon semiconductor layer, the oxide semiconductor TFT including: an oxide semiconductor layer that includes a second channel region, and a second source contact region and a second drain contact region that are respectively disposed on opposite sides of the second channel region; a second gate electrode disposed on a part of the oxide semiconductor layer via a second gate insulating layer; and a second source electrode that is in contact with the second source contact region of the oxide semiconductor layer and a second drain electrode that is in contact with the second drain contact region of the oxide semiconductor layer, wherein, as viewed from a normal direction of the substrate, the crystalline silicon semiconductor layer includes a third portion that overlaps the first gate electrode and a fourth portion that is located between the third portion and the first source contact region or first drain contact region, the first gate insulating layer covering at least the third portion and the fourth portion of the crystalline silicon semiconductor layer; as viewed from the normal direction of the substrate, the oxide semiconductor layer includes a first portion that overlaps the second gate electrode, and a second portion that is located between the first portion and the second source contact region or second drain contact region, such that the second gate insulating layer covers the first portion but does not cover the second portion; and the second gate electrode has a multilayer structure including an alloy layer that is in contact with the second gate insulating layer and a metal layer disposed on the alloy layer, wherein the metal layer is made of a first metallic element M; the alloy layer is made of an alloy containing the first metallic element M; and the first metallic element M is Cu, Mo, or Cr.

The alloy may be an alloy that contains the first metallic element M as a main component.

The first gate electrode may have the same multilayer structure as the second gate electrode.

The oxide semiconductor layer may comprise an In—Ga—Zn—O based semiconductor.

The oxide semiconductor layer may include a crystalline portion.

The oxide semiconductor layer may have a multilayer structure.

A method of producing an active matrix substrate according to an embodiment of the present invention is a method of producing an active matrix substrate including an oxide semiconductor TFT, the method comprising: a step of forming an oxide semiconductor layer on a substrate; a step of forming a gate insulating layer so as to cover the oxide semiconductor layer; a step of forming a film of alloy containing a first metallic element M on the gate insulating layer so as to be in contact with an upper face of the gate insulating layer, and thereafter forming a metal film made of the first metallic element M on the alloy film, to form an electrically conductive film for the gate that includes the alloy film and the metal film; a step of forming a resist layer on a part of the electrically conductive film for the gate, and patterning the electrically conductive film for the gate by using the resist layer as a mask, to form an upper gate electrode; a step of etching the gate insulating layer, by using the resist layer and the upper gate electrode as a mask, to expose a part of the oxide semiconductor layer; a step of removing the resist layer from the upper gate electrode by using a resist stripper and allowing the resist stripper to be in contact with an exposed portion of the oxide semiconductor layer, thereby allowing the first metallic element M being dissolved in the resist stripper to be admixed into the oxide semiconductor layer; and a step of forming an interlayer insulating layer that covers the oxide semiconductor layer, the gate insulating layer, and the upper gate electrode.

The alloy film may be a film of alloy that contains the first metallic element M as a main component.

The oxide semiconductor layer may comprise an In—Ga—Zn—O based semiconductor.

The oxide semiconductor layer may include a crystalline portion.

The oxide semiconductor layer may have a multilayer structure.

Advantageous Effects of Invention

According to an embodiment of the present invention, an active matrix substrate having oxide semiconductor TFTs which allow an OFF-leak current to be further reduced is provided.

DESCRIPTION OF EMBODIMENTS

Figure 1:
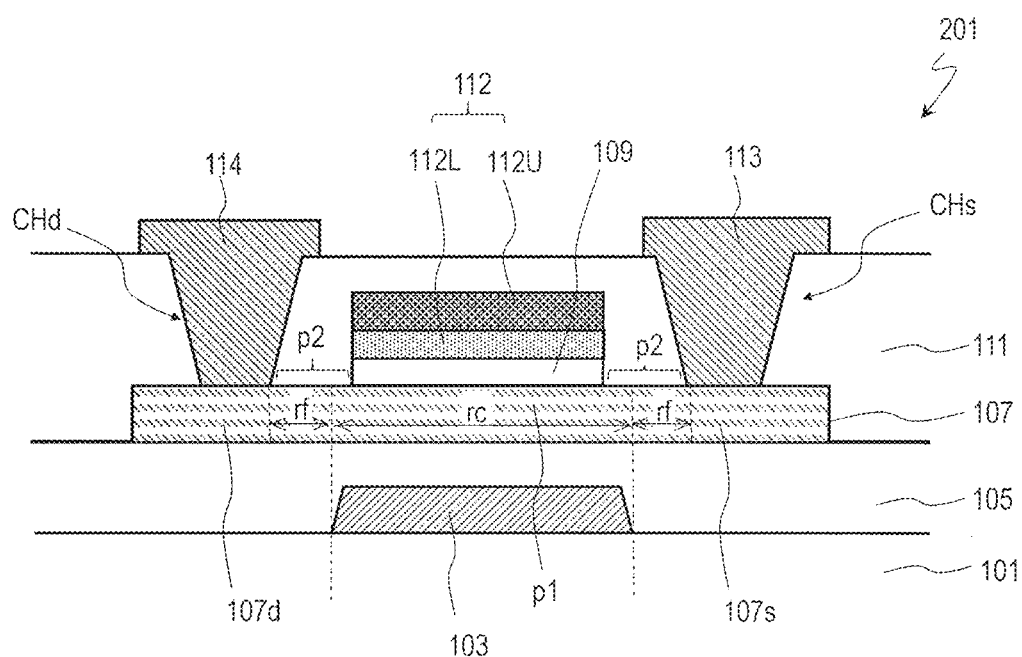
FIGS. 1(a) and (b) are a cross-sectional view and a plan view, respectively, illustrating an exemplary oxide semiconductor TFT 201 according to Embodiment 1.
Figure 1:
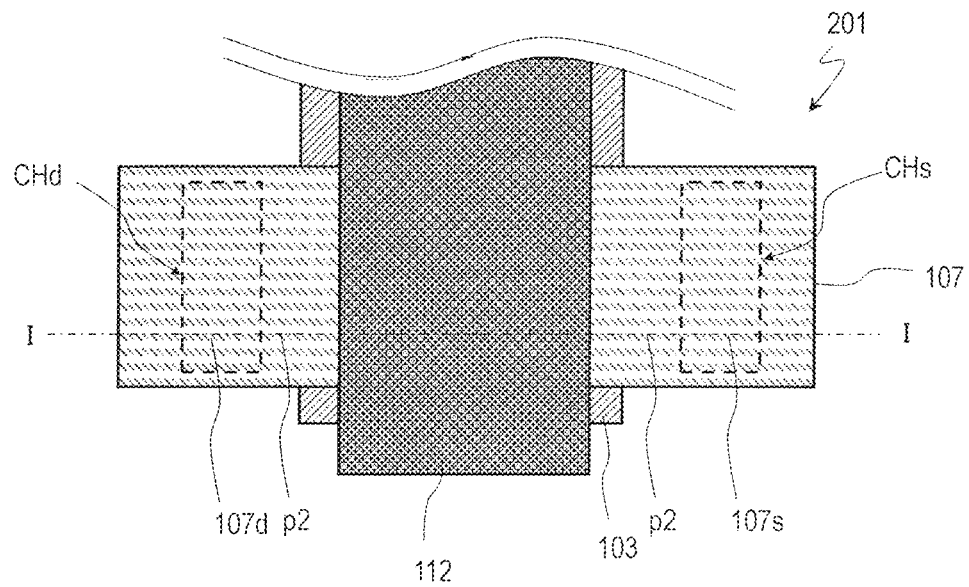

As described above, a conventional oxide semiconductor TFT having a top gate structure disclosed in e.g. Patent Document 2 has a problem of increased OFF-leak current. Therefore, there have been cases where it is difficult to use oxide semiconductor TFTs having a top gate structure as pixel TFTs, for example.

The inventors have sought for causes for the increased OFF-leak current, to arrive at the following findings. In the TFT structure disclosed in Patent Document 2, the source electrode and the drain electrode are respectively in contact with parts (referred to as a "source contact region" and a "drain contact region") of the oxide semiconductor layer. Between the source contact region and the drain contact region, a gate electrode (also called an upper gate electrode or a top gate) is disposed upon the oxide semiconductor layer, via a gate insulating film. In Patent Document 2, the gate insulating film is formed through self-alignment by using the upper gate electrode as a mask. In such structure, in order to avoid electrical conduction between the source/drain and the gate, a portion that is covered neither by the gate electrode nor the gate insulating film exists in the oxide semiconductor layer, between the source contact region and the drain contact region. Presumably, this portion may lower in resistance through the fabrication process, thereby resulting in an increased OFF-leak current.

Note that a similar problem may also occur in the case of a double-gate structure, which features both a top gate and a bottom gate.

In the present specification, as viewed from a normal direction of the substrate, a portion of the oxide semiconductor layer that overlaps the upper gate electrode is referred to as a "first portion", whereas a portion which is located between the first portion and the source contact region or the drain contact region and which is not covered by the upper gate electrode and the gate insulating film will be referred to as a "second portion".

In an oxide semiconductor TFT having the above structure, in order to reduce the OFF-leak current, it is desired to suppress lowering of resistance in the second portions of the oxide semiconductor layer.

On the other hand, the inventors have paid attention to the fact that, when a metal such as Cu is admixed into the oxide semiconductor, the electrical resistance of the oxide semiconductor increases, and found that lowering of resistance in an oxide semiconductor layer can be suppressed by using a metal such as Cu that is contained in the upper gate electrode. According to an embodiment of the present invention, by allowing a metal that is contained in the gate electrode to be intentionally admixed into the oxide semiconductor layer, the first portion of the oxide semiconductor layer can be increased in resistance, and/or lowering of resistance in the second portions can be suppressed. As a result, the OFF-leak current can be reduced, and desired TFT characteristics can be achieved.

Hereinafter, with reference to the drawings, embodiments of the present invention will be described. Active matrix substrates according to embodiments of the present invention can be broadly used in various display devices, electronic appliances, and so on. Note that the present invention is not to be limited by the following embodiments.

Embodiment 1

An active matrix substrate according to Embodiment 1 includes a substrate and at least one oxide semiconductor TFT supported on the substrate. For example, the oxide semiconductor TFT may be disposed in each pixel of an active matrix substrate, so as to serve as a pixel TFT. Oxide semiconductor TFTs may be used either as pixel TFTs or circuit TFTs composing driving circuits, etc.

Hereinafter, a TFT of a double-gate structure having both a bottom gate and a top gate will be taken for example. Note that, as will be described later, an oxide semiconductor TFT according to the present embodiment may be a TFT of a single-gate structure having only a top gate.

FIGS. 1(a) and (b) are a cross-sectional view and a plan view, respectively, illustrating an exemplary oxide semiconductor TFT 201 according to Embodiment 1. FIG. 1(a) shows a cross section taken along line I-I in FIG. 1(b).

The oxide semiconductor TFT 201 includes a substrate 101, a lower gate electrode (bottom gate) 103 supported on the substrate 101, a lower insulating layer 105 covering the lower gate electrode 103, and an oxide semiconductor layer 107 disposed on the lower insulating layer 105. On the oxide semiconductor layer 107, an upper gate electrode (top gate) 112 is disposed via an upper insulating layer (also referred to as a gate insulating layer) 109. Moreover, a source electrode 113 is disposed so as to be in contact with a part (source contact region) 107s of the oxide semiconductor layer 107, and a drain electrode 114 is disposed so as to be in contact with another part (drain contact region) 107d of the oxide semiconductor layer 107.

The lower gate electrode 103 is opposed to the oxide semiconductor layer 107, via the lower insulating layer 105. The upper gate electrode 112 is opposed to the oxide semiconductor layer 107, via the upper insulating layer 109. Therefore, the lower insulating layer 105 and the upper insulating layer 109 both function as gate insulating layers (and may be referred to as the lower gate insulating layer and the upper gate insulating layer).

In this example, the upper insulating layer 109 is formed exclusively on a region of the oxide semiconductor layer 107 that overlaps the upper gate electrode 112. The upper insulating layer 109 may be island-shaped. The upper gate electrode 112 and the upper insulating layer 109 may be patterned by using the same mask, for example. In this case, as viewed from the normal direction of the substrate 101, the peripheral edge of the upper gate electrode 112 and the peripheral edge of the upper insulating layer 109 may be aligned.

As viewed from the normal direction of the substrate 101, the oxide semiconductor layer 107 includes a first portion p1 that overlaps the upper gate electrode 112 and second portions p2 that are located between the first portion p1 and the source contact region 107s or drain contact region 107d. The upper insulating layer 109 is disposed between the first portion p1 and the upper gate electrode 112, and does not cover the second portions p2.

The upper gate electrode 112 has a multilayer structure including an alloy layer 112L and a metal layer 112U disposed above the alloy layer 112L. The alloy layer 112L is in contact with an upper face of the upper insulating layer 109.

The metal layer 112U is made of a first metallic element M. The first metallic element M is a metal which, when admixed in the oxide semiconductor layer 107, lowers the carriers in the oxide semiconductor, and may be Cu, Mo, or Cr, for example.

The alloy layer 112L at least contains a first metallic element M and a second metallic element X. The second metallic element X may be Mg, Al, Ca, Mo, Mn, W, Zr, or the like, for example. The alloy may be a binary alloy, or a multi-component alloy that is composed of three or more components. The alloy may contain the second metallic element X in an amount of not less than 10 weight % and not more than 80 weight %, for example. When the second metallic element X accounts for not less than 10 weight %, adhesion with the upper insulating layer (which herein is silicon oxide) 109 can be sufficiently enhanced. When it accounts for not more than the 80 weight %, electrical resistance can be kept low.

The alloy layer 112L may be made of an alloy that contains the first metallic element M as a main component. An alloy that contains the first metallic element M as a main component may, for example, contain the first metallic element M in an amount which is more than 50 weight % and the second metallic element X in an amount which is not less than 10 weight % but less than 50 weight %. Preferably, the first metallic element M is contained in an amount of 60 weight % or more, and more preferably in an amount of 70% weight or more. In one example, the metal layer 112U may be a Cu layer while the alloy layer 112L may be a Cu alloy layer composed of a Cu alloy. Examples of Cu alloys include Cu-30% Mg, Cu-30% Al, Cu-30% C a, and the like.

The oxide semiconductor layer 107, the upper insulating layer 109, and the upper gate electrode 112 are covered by an interlayer insulating layer 111. In the interlayer insulating layer 111, apertures (contact holes) CHs and CHd are created which respectively reach the source contact region 107s and the drain contact region 107d of the oxide semiconductor layer 107. The source electrode 113 is disposed on the interlayer insulating layer 111 and in the source aperture CHs, so as to be in contact with the source contact region 107s within the source aperture CHs. The drain electrode 114 is disposed on the interlayer insulating layer 111 and in the drain aperture CHd, so as to be in contact with the drain contact region 107d within the drain aperture CHd. It is preferable that, as viewed from the normal direction of the substrate 101, each of the source electrode 113 and the drain electrode 114 does not overlap the upper gate electrode 112.

In the oxide semiconductor TFT 201, a channel is created in a region rc of the oxide semiconductor layer 107 that overlaps at least one of the lower gate electrode 103 and the upper gate electrode 112. This region rc is referred to as a "channel region". Moreover, a region rf that is located between the channel region rc and the source contact region 107s or drain contact region 107d is referred to as an "offset region". The channel region rc includes a first portion p1 that overlaps the upper gate electrode 112. The channel region rc may include at least a part of the second portions p2. In this example, as viewed from the normal direction of the substrate 101, a part of each second portion p2 overlaps the lower gate electrode 103, and is included within the channel region rc. Another part of each second portion p2 overlaps neither the lower gate electrode 103 nor the upper gate electrode 112, and is included within the offset region rf. In the case of a top gate structure (i.e., there being no lower gate electrode 103), the first portion p1 is the channel region rc, and the second portions p2 are the offset regions rf.

According to the present embodiment, by utilizing the first metallic element M contained in the upper gate electrode 112, the first portion p1 of the oxide semiconductor layer 107 can be increased in resistance, and lowering of resistance in the second portions p2 can also be suppressed. Hereinafter, this will be described more specifically.

Figure 2:
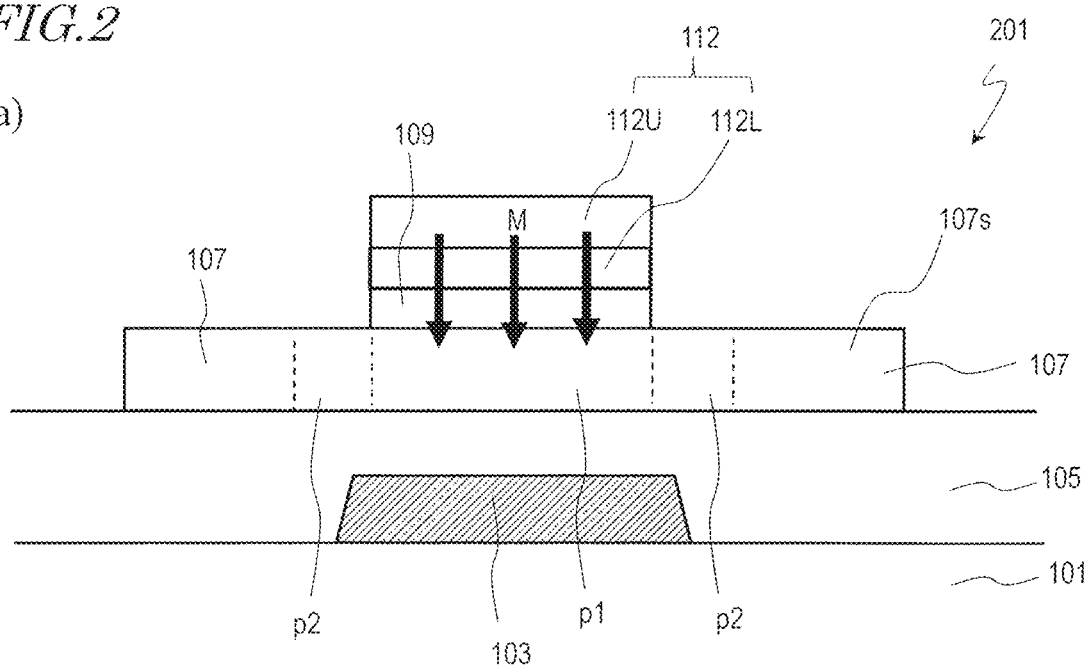
FIGS. 2(a) and (b) are cross-sectional views showing a part of, respectively, the oxide semiconductor TFT 201 according to Embodiment 1 and a conventional oxide semiconductor TFT 900.
Figure 2:
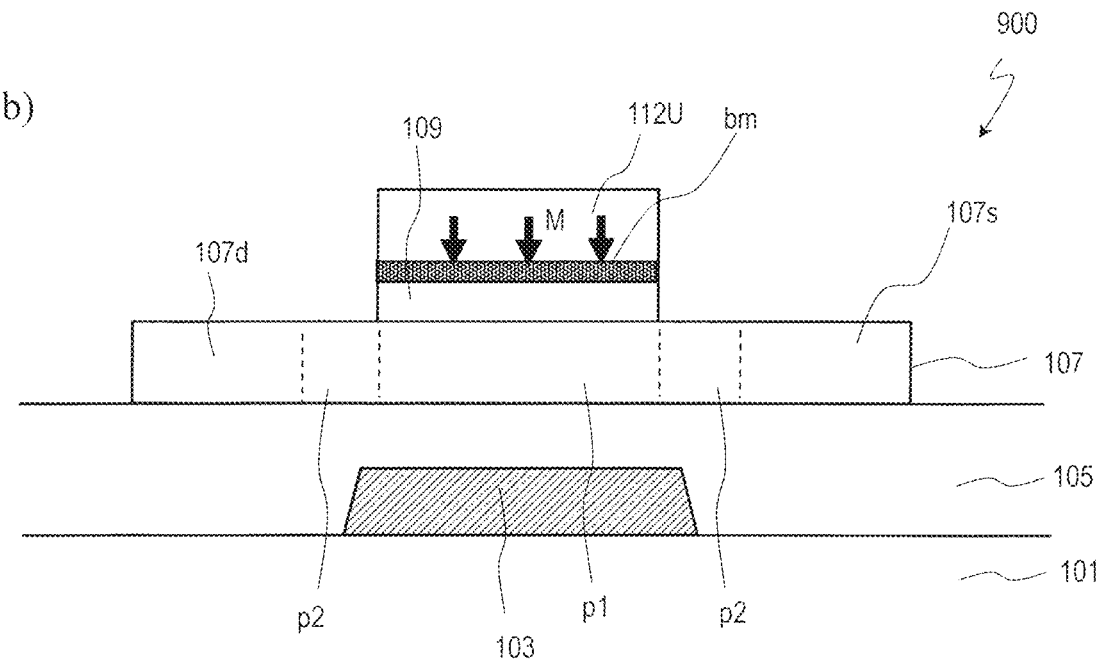

FIGS. 2(a) and (b) are cross-sectional views showing a part of, respectively, the oxide semiconductor TFT 201 and an oxide semiconductor TFT 900 as a reference example.

In the present embodiment, as shown in FIG. 2(a), the alloy layer 112L is disposed so as to be in contact with the upper insulating layer 109, whereby adhesion between the upper insulating layer 109 (e.g., a silicon oxide layer) and the upper gate electrode 112 can be improved, and also the first metallic element M in the metal layer 112U can be admixed into the first portion p1 of the oxide semiconductor layer 107, beyond the interface between the alloy layer 112L and the upper insulating layer 109. As a result, electrical resistance of the first portion p1 can be increased. Thus, in the present embodiment, the first metallic element M, e.g., Cu, is intentionally diffused into the first portion p1, thereby increasing the first portion p1 in resistance.

If, as shown in FIG. 2(b), a barrier metal layer bm such as a Ti film is disposed on the oxide semiconductor layer 107 side of the metal layer 112U, then the first metallic element M in the metal layer 112U will be obstructed by the barrier metal layer bm, thus having difficulty being admixed into the oxide semiconductor layer 107. In the present embodiment, no barrier metal layer is disposed between the metal layer 112U and the upper insulating layer 109, thus allowing the first metallic element M to move to the oxide semiconductor layer 107 more easily.

The amount of first metallic element M to be admixed into the first portion p1 can be controlled by the thickness of the upper insulating layer 109, for example. The thickness of the upper insulating layer 109 may be e.g. not less than 90 µm and not more than 200 µm. When it is not more than 200 µm, it is easier to diffuse the first metallic element M from the upper gate electrode 112 into the oxide semiconductor layer 107 via the upper insulating layer 109, whereby resistance of the first portion p1 can be increased such that the OFF-leak current can be reduced more effectively. On the other hand, when it is not less than 90 µm, deteriorations in the ON characteristics due to excessive admixing of the first metallic element M into the oxide semiconductor layer 107 can be suppressed. The first portion p1 may contain the first metallic element M at a concentration of more than 0 atom % but not more than 0.5 atom % with respect to the oxide semiconductor, for example. As a result, desired TFT characteristics can be achieved.

Furthermore, in accordance with a fabrication process as described below, during a step of patterning the upper gate electrode 112, a stripper for a photoresist for removing the mask will come in contact with the portion of the oxide semiconductor layer 107 that is exposed from the upper insulating layer 109 (including the second portions). At this time, the first metallic element M that is dissolved in the remover is admixed into the exposed portion of the oxide semiconductor layer 107. As a result of this, lowering of resistance in the second portions p2 is suppressed. Even in the case where such a fabrication process is not used, resistance of the first portion p1 of the oxide semiconductor layer 107 can be increased so long as the upper gate electrode 112 has the aforementioned structure, whereby effects of reducing the OFF-leak current can be obtained.

In the oxide semiconductor layer 107, electrical resistance may decrease, in this order, from the first portion p1, the second portions p2, the source contact region 107s, and to the drain contact region 107d. Alternatively, depending on the thickness of the upper insulating layer 109, the second portions p2 may have a higher electrical resistance than does the first portion p1. Although there is no particular limitation as to the concentration of the first metallic element M in the second portions p2, it may be a concentration of more than 0 atom % but not more than 0.5 atom % with respect to the oxide semiconductor, for example.

The width of the lower gate electrode 103 along the channel length direction may be greater than the width of the upper gate electrode 112 along the channel length direction. This will allow a part of each second portion p2 of the oxide semiconductor layer 107 to function as the channel region rc. Stated otherwise, the length of each offset region rf along the channel length direction can be made smaller than the length of each second portion p2 of the oxide semiconductor layer 107 along the channel length direction. Thus, while securing a high ON current, the OFF-leak current can be reduced.

The length of each second portion p2 along the channel length direction may be not less than 4 µm and not more than 10 µm, for example. When it is not less than 4 µm, the upper gate electrode 112, the source electrode 113, and the drain electrode 114 can be electrically isolated with a more certainty, and the overlapping capacitance between these electrodes can be reduced (or eliminated). Furthermore, the OFF-leak current can be effectively reduced. On the other hand, when it is not more than 10 µm, increase in the size of the oxide semiconductor TFT 201 can be suppressed. The length x of each second portion p2 may be not less than ¼ times but not more than ½ times the channel length L of the oxide semiconductor TFT 201.

Figure 3A:
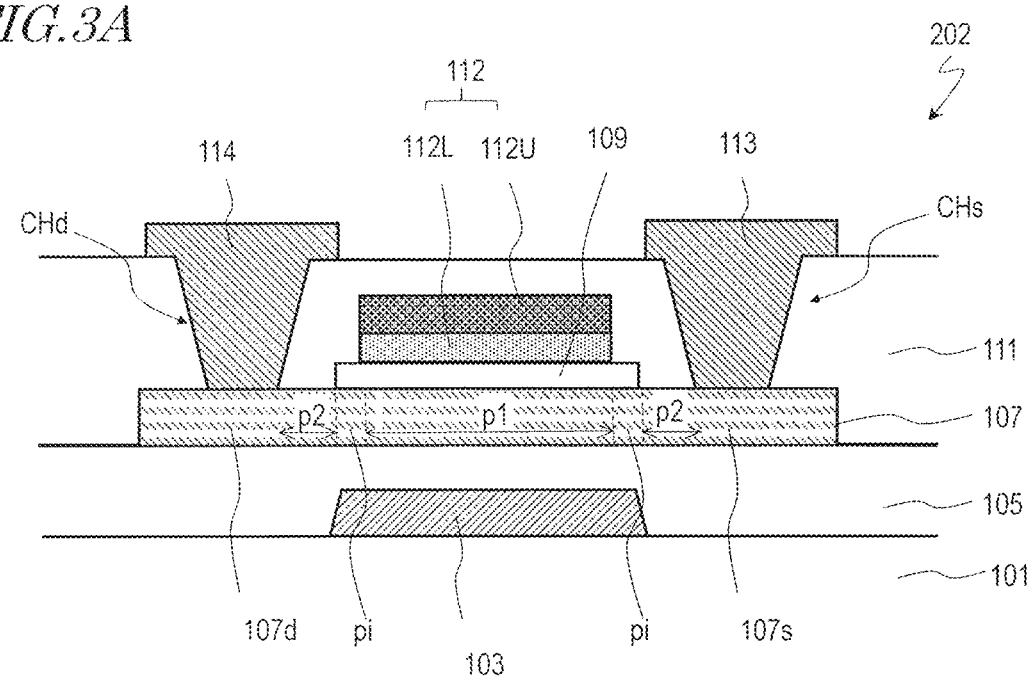
FIG. 3A A cross-sectional view showing another oxide semiconductor TFT 202 according to Embodiment 1.

In the oxide semiconductor TFT 201, the upper insulating layer 109 is formed only on the first portion p1 of the oxide semiconductor layer 107; however, it suffices if the upper insulating layer 109 covers the first portion p1 and yet does not cover the second portions p2. For example, as illustrated in FIG. 3A, as viewed from the normal direction of the substrate 101, the upper gate electrode 112 may be located inside the peripheral edge of the upper insulating layer 109. In this case, any portion of the oxide semiconductor layer 107 which is located between the first portion p1 and the source and drain contact regions 107s and 107d and which is exposed from the upper insulating layer 109 defines the second portions p2. Since the second portions p2 are exposed from the upper insulating layer 109, the first metallic element M can be admixed into the second portions p2 by utilizing the resist stripper. In this case, the concentration of the first metallic element M in the second portions p2 and the first portion p1 will be higher than the concentration of the first metallic element M in a portion pi that is located between each second portion p2 and the first portion p1 (i.e., a portion which is covered by the upper insulating layer 109 but which is not covered by the upper gate electrode 112).

Figure 3B:
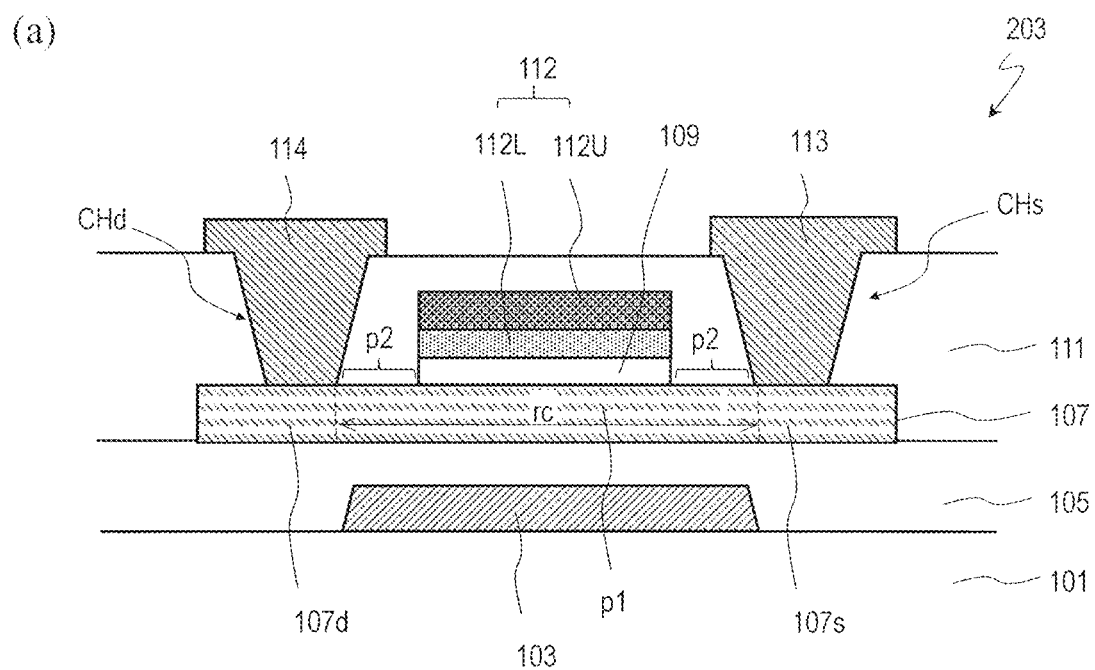
FIGS. 3B(a) and (b) are cross-sectional views respectively showing still other oxide semiconductors TFTs 203 and 204 according to Embodiment 1.
Figure 3B:
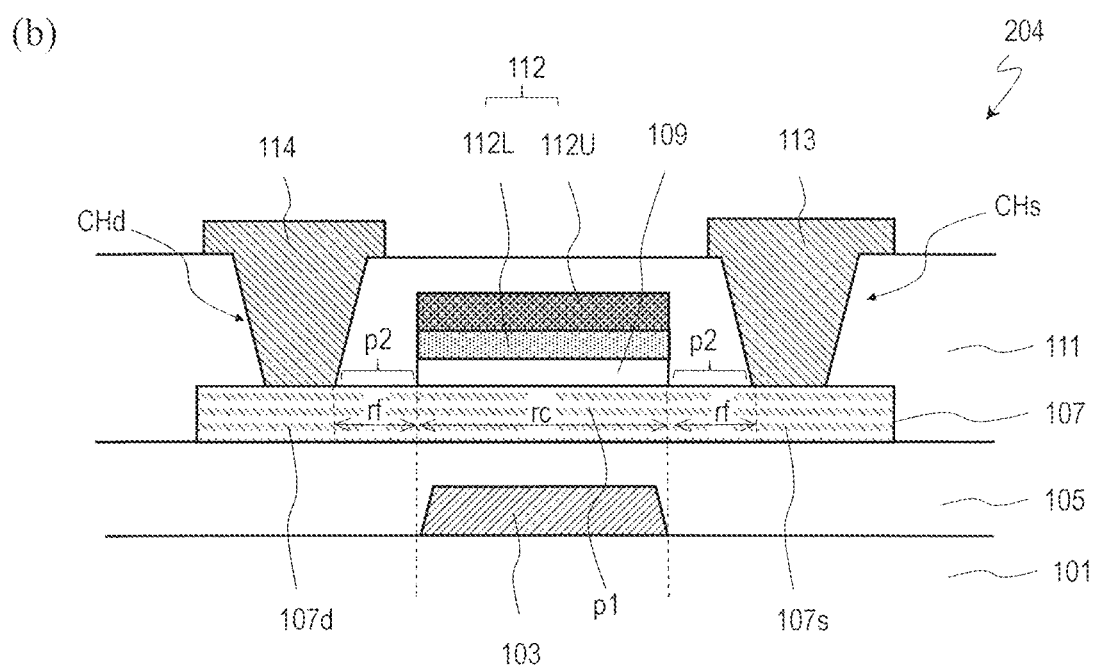

Moreover, as illustrated in FIG. 3B(a), the lower gate electrode 103 may be disposed so as to overlap the entirety of the second portions p2 and the first portion p1 as viewed from the normal direction of the substrate 101. In that case, the channel region rc includes the second portions p2 and the first portion p1. On the other hand, the offset regions rf are not created. Furthermore, as shown in FIG. 3B(b), if the entire lower gate electrode 103 is disposed so as to overlap the upper gate electrode 112 as viewed from the normal direction of the substrate 101, the first portion p1 defines the channel region and the second portions p2 define the offset regions.

Figure 4:
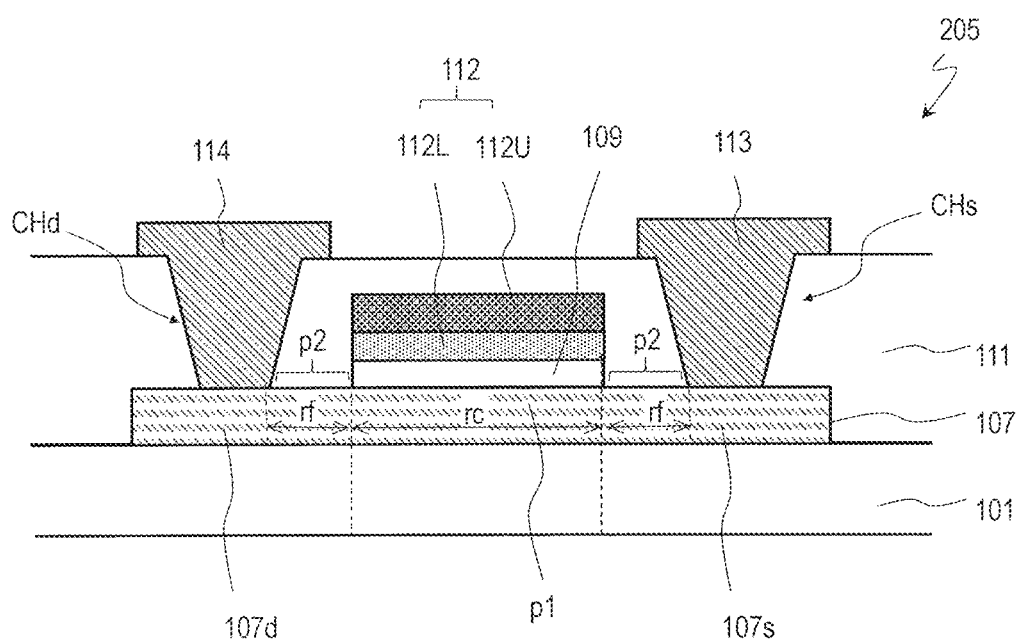
FIGS. 4(a) and (b) are a cross-sectional view and a plan view, respectively, showing still another oxide semiconductor TFT 205 according to Embodiment 1.
Figure 4:
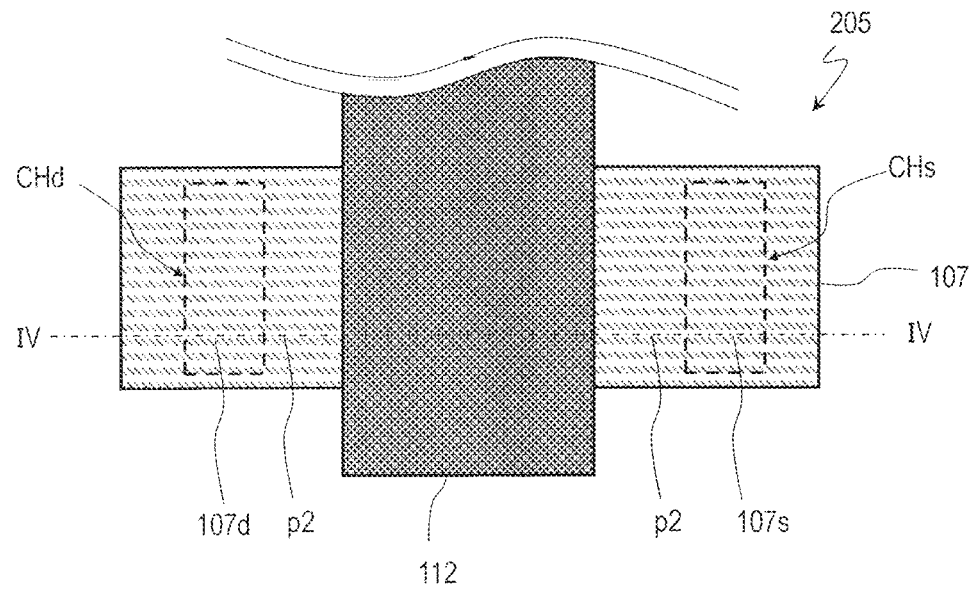

Although the above-described oxide semiconductor TFT 201 has a double-gate structure, the oxide semiconductor TFT 201 may have a single-gate structure having only the upper gate electrode 112. In that case, on the substrate 101 side of the lower insulating layer 105, a light shielding film which shades the channel region of the oxide semiconductor layer 107 may be provided, instead of the lower gate electrode 103. Alternatively, as shown in FIGS. 4(a) and (b), no electrically conductive film may be formed on the substrate 101 side of the oxide semiconductor layer 107.

In the present embodiment, the upper gate electrode 112 has a two-layer structure; however, so long as the upper gate electrode 112 includes the alloy layer 112L and the metal layer 112U, it may have a multilayer structure with three or more layers. However, preferably, no barrier metal layer such as a Ti film is included on the substrate 101 side of the metal layer 112U.

<Method of Producing Oxide Semiconductor TFT 201>

Figure 5:
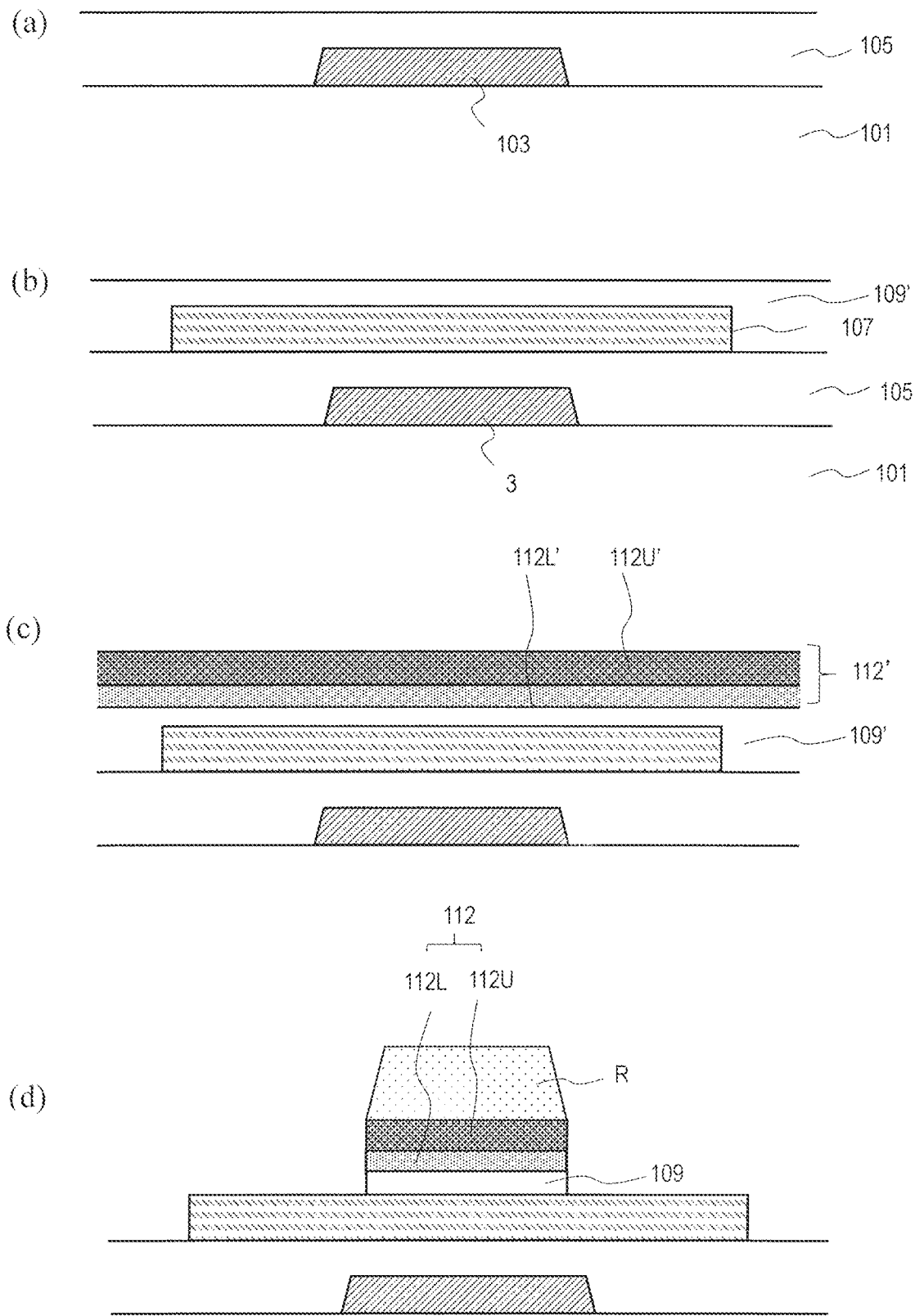
FIG. 5(a) through (d) are step-by-step cross-sectional views showing a method of producing an oxide semiconductor TFT according to Embodiment 1.
Figure 6:
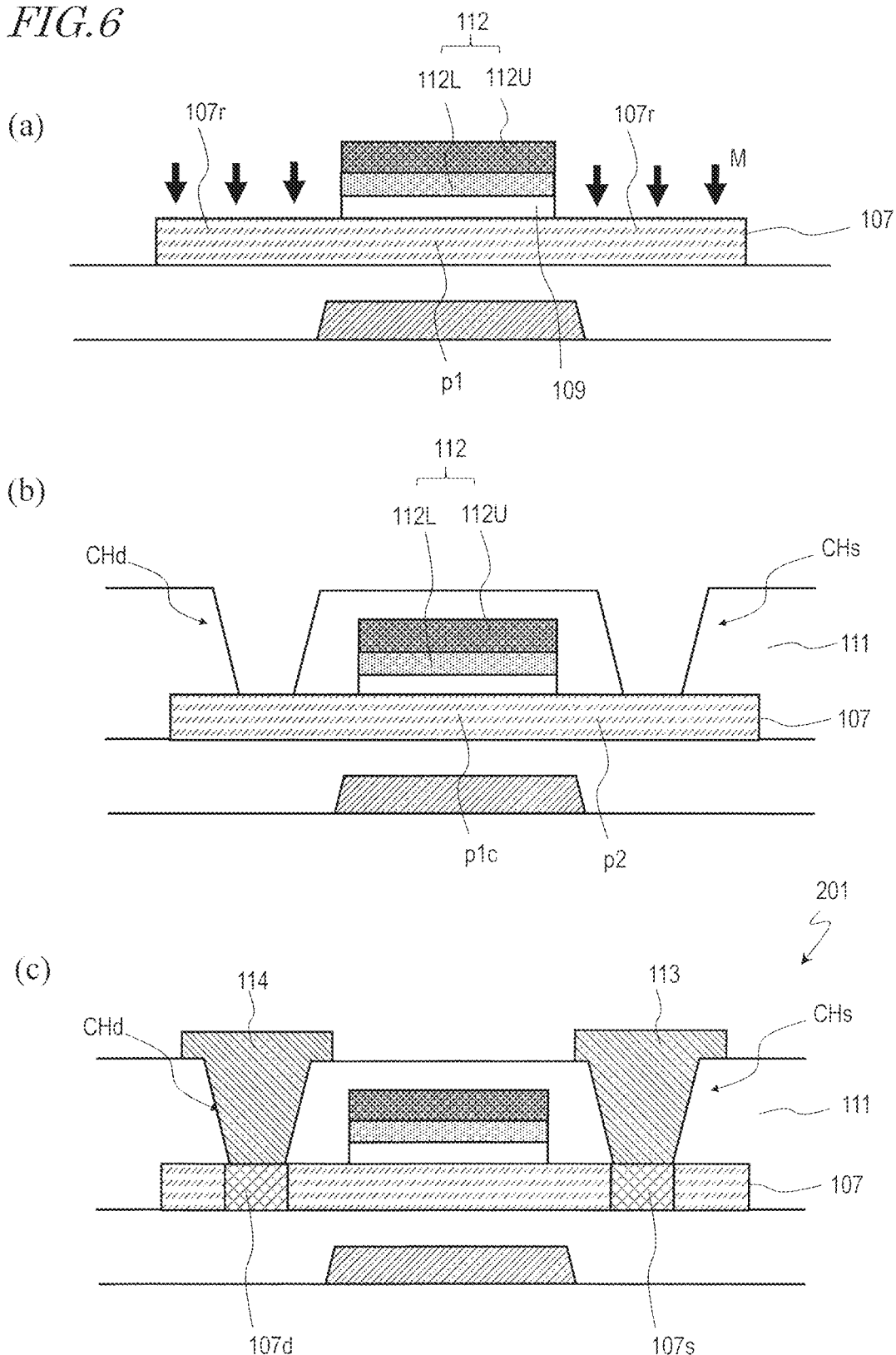
FIG. 6(a) through (c) are step-by-step cross-sectional views showing a method of producing an oxide semiconductor TFT according to Embodiment 1.

Next, an example method of producing the oxide semiconductor TFT 201 will be described. FIG. 5 and FIG. 6 are step-by-step cross-sectional views for describing a method of producing the oxide semiconductor TFT 201.

First, as shown in FIG. 5(a), a lower gate electrode 103 is formed on a substrate 101. Specifically, after depositing a first electrically conductive film on the substrate 101, the first electrically conductive film is patterned, thereby providing the lower gate electrode 103. The material of the first electrically conductive film may be an MoW alloy, for example. The thickness of the lower gate electrode 103 may be e.g. not less than 50 nm and not more than 500 nm. Next, a lower insulating layer 105 is formed so as to cover the lower gate electrode 103. The lower insulating layer 105 may be a silicon oxide (SiOx) layer, a silicon nitride (SiNx) layer, a silicon oxynitride (SiNxOy) layer, or the like, for example. The thickness of the lower insulating layer 105 may be e.g. not less than 150 nm and not more than 500 nm.

Then, as shown in FIG. 5(b), an oxide semiconductor layer 107 is formed on the lower insulating layer 105. Specifically, after the oxide semiconductor film is deposited on the lower insulating layer 105, the oxide semiconductor film may be patterned to form the oxide semiconductor layer 107. The thickness of the oxide semiconductor layer 107 may be e.g. not less than 10 nm and not more than 150 nm.

Thereafter, an insulating film 109' to become an upper insulating layer is formed so as to cover the oxide semiconductor layer 107. The insulating film 109' may be a silicon oxide (SiOx) layer, for example. The thickness of the insulating film 109' may be e.g. not less than 90 nm and not more than 200 nm.

Then, as shown in FIG. 5(c), a second electrically conductive film (thickness: not less than 60 nm and not more than 700 nm) 112' to become the upper gate electrode is deposited on the insulating film 109'. Herein, an alloy film 112L' containing a first metallic element M and a second metallic element X and a metal film 112U' which is composed of the first metallic element M are deposited in this order. The metal film 112U' may be a Cu film, an Mo film, or a Cr film, for example. In the case where the metal film 112U' is a Cu film, the alloy film 112L' may be a Cu alloy film which is e.g., Cu—Mg based, Cu—Al based, Cu—Ca based, Cu—Mo based, or Cu—Mn based, for example. Other than Mg, Al, Ca, Mo, and Mn as aforementioned, the second metallic element X to form an alloy with Cu may be W, Zr, or the like.

Next, as shown in FIG. 5(d), the second electrically conductive film 112' is patterned to form an upper gate electrode 112. Specifically, first, a resist layer R to serve as an etching mask is formed on a part of the second electrically conductive film 112' by a photolithography step. Thereafter, by using the resist layer R as a mask, the second electrically conductive film 112' is patterned by wet etching. As a result, the upper gate electrode 112 is obtained which has a multilayer structure including an alloy layer 112L and a metal layer 112U.

The thickness of the alloy layer 112L may be e.g. not less than 30 nm and not more than 200 nm. As a result, while suppressing an increase in electrical resistance, adhesion with the gate insulating layer 109 can be provided. Moreover, the thickness of the metal layer 112U may be e.g. not less than 30 nm and not more than 500 nm. The metal layer 112U may be thicker than the alloy layer 112L.

Thereafter, by using the resist layer R as a mask, the insulating film 109' is patterned through dry etching, thereby providing an upper insulating layer 109. Any portion of the oxide semiconductor layer 107 other than the portion to overlap the upper gate electrode 112 via the upper insulating layer 109 (first portion) p1 is left exposed.

Then, as shown in FIG. 6(a), the resist layer R is removed by using a resist stripper. At this time, the resist stripper comes in contact with portions (exposed portions) 107r of the oxide semiconductor layer 107 that are not covered by the upper insulating layer 109 and the upper gate electrode 112, whereby a part of the first metallic element M dissolved in the resist stripper is admixed into the exposed portions 107r of the oxide semiconductor layer 107. As a result, lowering of resistance in the exposed portions 107r of the oxide semiconductor layer 107 can be suppressed. Although there is no limitation as to the exact kind of resist stripper, a remover (N405) that contains alkanolamine, glycols, and water as main components may suitably be used, for example.

For the purpose of protecting the oxide semiconductor layer 107, after the resist layer R is removed, the upper insulating layer 109 may be patterned by using the upper gate electrode 112 as a mask. In that case, however, the step of removing the resist layer R cannot be utilized in allowing the first metallic element M to be admixed into the oxide semiconductor layer 107. On the other hand, with the production method according to the present embodiment, the resist layer R is removed after the upper insulating layer 109 is patterned; therefore, the resist stripper containing the first metallic element M can attain contact with the oxide semiconductor layer 107.

Next, as shown in FIG. 6(b), an interlayer insulating layer 111 is formed so as to cover the oxide semiconductor layer 107, the upper insulating layer 109, and the upper gate electrode 112. The interlayer insulating layer 111 may be a silicon oxide (SiOx) layer, a silicon nitride (SiNx) layer, or a silicon oxynitride (SiNxOy) layer, for example. Moreover, the interlayer insulating layer 111 may have a multilayer structure in which such layers are stacked. The thickness of the interlayer insulating layer 111 may be e.g. not less than 150 nm and not more than 500 nm.

The interlayer insulating layer 111 may have a multilayer structure having a silicon oxide layer as a lower layer and a silicon nitride layer as an upper layer, for example. When the lower layer that is in contact with the oxide semiconductor layer 107 is an oxygen donor layer such as a silicon oxide layer, the second portions p2 of the oxide semiconductor layer 107 can be restrained from lowering in resistance because of the interlayer insulating layer 111.

Thereafter, a source aperture CHs and a drain aperture CHd are made in the interlayer insulating layer 111, so that parts of the oxide semiconductor layer 107 will be exposed.

Then, as shown in FIG. 6(c), a source electrode 113 and a drain electrode 114 are formed on the interlayer insulating layer 111 and in the source aperture CHs and the drain aperture CHd. The source electrode 113 and the drain electrode 114 can be formed by, after depositing a third electrically conductive film for the source/drain on the interlayer insulating layer 111, patterning the third electrically conductive film. As the material of the third electrically conductive film, for example, metals such as molybdenum (Mo), tungsten (W), aluminum (Al), copper (Cu), titanium (Ti), and tantalum (Ta), or an alloy thereof, can be used. The thicknesses of the source electrode 113 and the drain electrode 114 may be e.g. not less than 100 nm and not more than 500 nm. Regarding the exposed portions 107r (FIG. 6(a)) of the oxide semiconductor layer 107, regions thereof that are in contact with the source electrode 113 and the drain electrode 114 are lowered in resistance through contact with these electrodes, thus becoming a source contact region 107s and a drain contact region 107d. In this manner, the oxide semiconductor TFT 201 is produced.

Embodiment 2

Hereinafter, with reference to the drawings, an active matrix substrate according to Embodiment 2 of the present invention will be described. The active matrix substrate of the present embodiment includes, on the same substrate, a crystalline silicon semiconductor TFT (referred to as a "second TFT") whose active layer is a crystalline silicon semiconductor layer as well as an oxide semiconductor TFT (referred to as a "second TFT") described in Embodiment 1.

Figure 7:
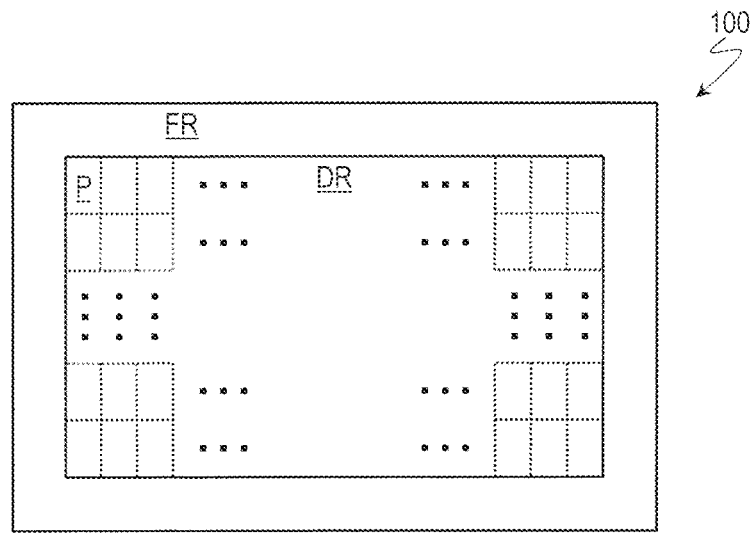
FIG. 7 A plan view schematically showing an active matrix substrate 100 according to an embodiment of the present invention.

FIG. 7 is a plan view schematically showing an active matrix substrate 100.

As shown in FIG. 7, the active matrix substrate 100 has a displaying region DR and a peripheral region FR. The displaying region DR is defined by a plurality of pixel regions P. The plurality of pixel regions P are arranged in a matrix shape including a plurality of rows and a plurality of columns. The displaying region DR may also be referred to as an "active region". The peripheral region FR is located around the displaying region DR. The peripheral region FR may also be referred to as a "frame region". Peripheral circuitry (not shown) is provided in the peripheral region FR.

Figure 8:
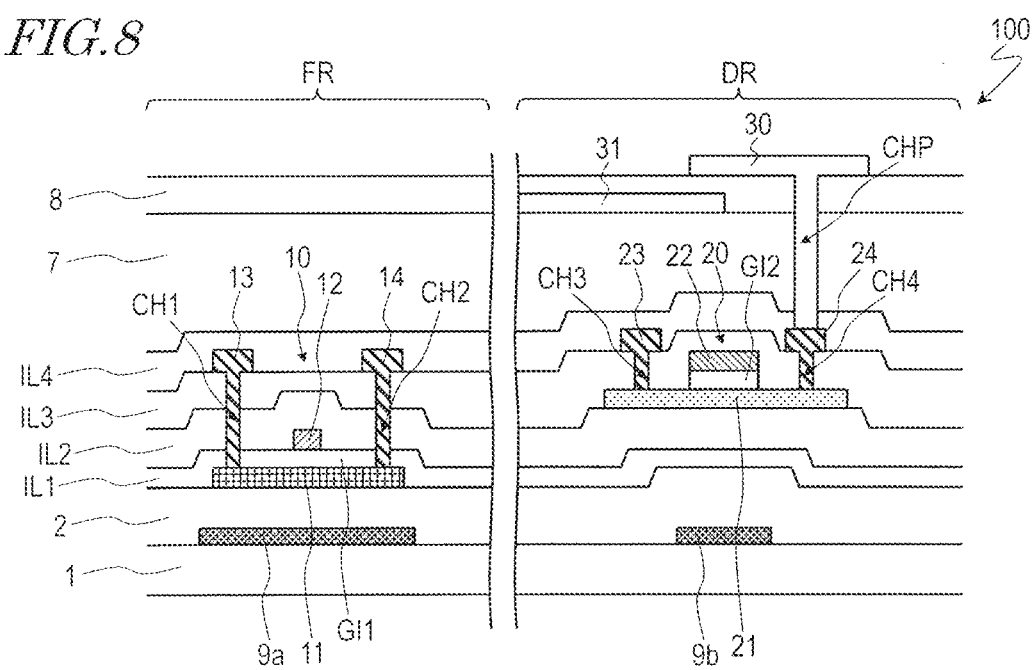
FIG. 8 A cross-sectional view schematically showing the active matrix substrate 100, where a circuit TFT that is provided in a peripheral region FR is shown on the left side and a pixel TFT that is provided in a displaying region DR is shown on the right side.
Figure 9:
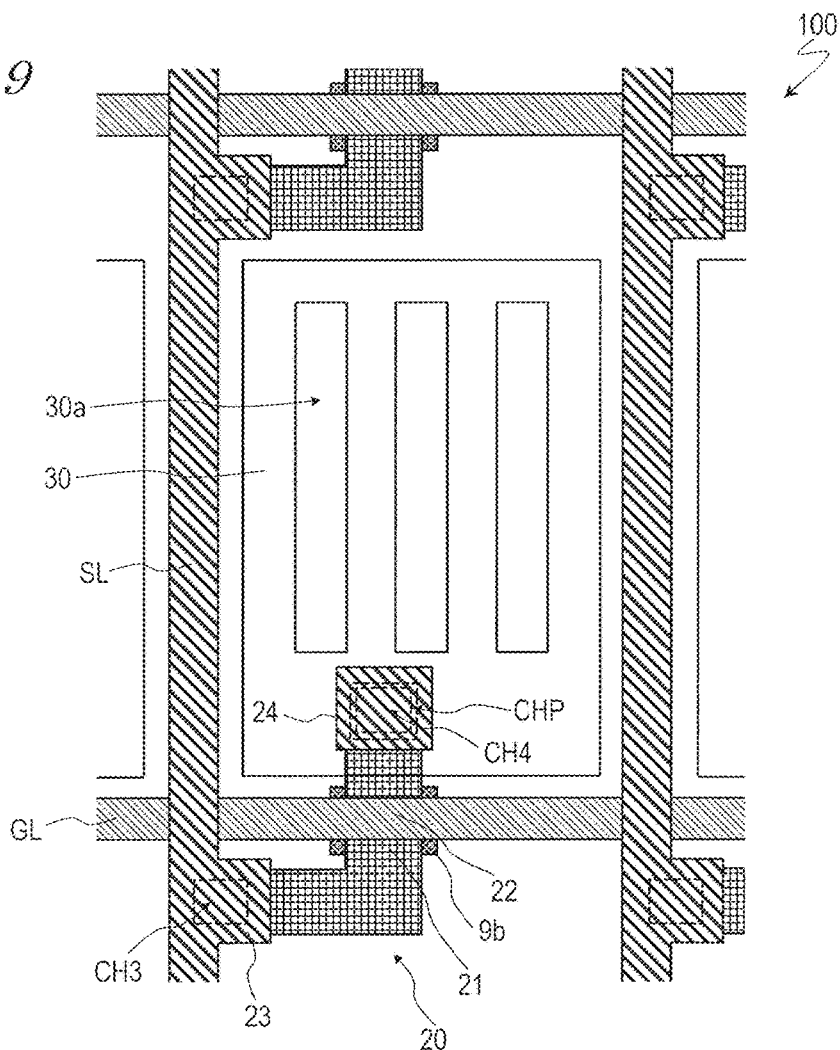
FIG. 9 A plan view schematically showing the active matrix substrate 100, depicting a single pixel region P.

With reference also to FIG. 8 and FIG. 9, a more specific construction of the active matrix substrate 100 will be described. FIG. 8 and FIG. 9 are, respectively, a cross-sectional view and a plan view schematically showing the active matrix substrate 100. In FIG. 8, a circuit TFT that is provided in the peripheral region FR is shown on the left side, whereas a pixel TFT that is provided in the displaying region DR is shown on the right side. FIG. 9 illustrates one pixel region P. FIG. 8 and FIG. 9 illustrate an exemplary active matrix substrate 100 for use in a liquid crystal display device of an FFS (Fringe Field Switching) mode.

As shown in FIG. 8 and FIG. 9, the active matrix substrate 100 includes a substrate 1 and a first TFT 10 and a second TFT 20 supported on the substrate 1. The first TFT 10 is disposed in the peripheral region FR. The second TFT 20 is disposed in the displaying region DR.

The first TFT 10 includes a crystalline silicon semiconductor layer 11 as an active layer. In other words, the first TFT 10 is a crystalline silicon TFT. Moreover, the first TFT 10 is a circuit TFT composing peripheral circuitry. In addition to the aforementioned crystalline silicon semiconductor layer 11, the first TFT 10 also includes a first gate insulating layer GI1, a first gate electrode 12, a first source electrode 13, and a first drain electrode 14.

In the present embodiment, the crystalline silicon semiconductor layer 11 is a polycrystalline silicon layer (e.g., a low-temperature polysilicon (LIPS) layer). In the example shown in the figure, a basecoat layer (underlying layer) 2 is provided on the substrate 1, such that the crystalline silicon semiconductor layer 11 is disposed on the basecoat layer 2.

The first gate insulating layer GI1 is disposed on the crystalline silicon semiconductor layer 11. In the present embodiment, a first insulating layer IL1 including the first gate insulating layer GI1 is formed on the basecoat layer 2 and the crystalline silicon semiconductor layer 11, such that a part (i.e., a portion covering the crystalline silicon semiconductor layer 11) of the first insulating layer IL1 functions as the first gate insulating layer GI1.

The first gate electrode 12 is disposed on the first gate insulating layer GI1. The first gate electrode 12 is opposed to the crystalline silicon semiconductor layer 11 via the first gate insulating layer GI1.

The first source electrode 13 and the first drain electrode 14 are electrically connected to the crystalline silicon semiconductor layer 11. In the present embodiment, on the first insulating layer IL1, a second insulating layer (interlayer insulating layer) IL2 that includes a portion covering the first gate electrode 12 is provided. The second insulating layer IL2 is a single layer that does not have a multilayer structure. On the second insulating layer IL2, a third insulating layer (passivation layer) IL3 is provided. The first source electrode 13 and the first drain electrode 14 are disposed on the third insulating layer IL3. The first source electrode 13 and the first drain electrode 14 are respectively connected to parts (a first source contact region and a first drain contact region) of the crystalline silicon semiconductor layer 11, within a first contact hole CH1 and a second contact hole CH2 which are made in the first insulating layer IL1 (first gate insulating layer GI1), the second insulating layer IL2, and the third insulating layer IL3.

As viewed from the normal direction of the substrate 1, the crystalline silicon semiconductor layer 11 includes a third portion that overlaps the first gate electrode 12 and fourth portions that are located between the third portion and the first source contact region or first drain contact region. The first gate insulating layer GI1 covers at least the third portion and the fourth portions of the crystalline silicon semiconductor layer 11.

The second TFT 20 includes an oxide semiconductor layer 21 as an active layer. In other words, the second TFT 20 is an oxide semiconductor TFT. Moreover, the second TFT 20 is a pixel TFT that is to be disposed in each of the plurality of pixel regions P. In addition to the aforementioned oxide semiconductor layer 21, the second TFT 20 also includes a second gate insulating layer GI2, a second gate electrode 22, a second source electrode 23, and a second drain electrode 24.

The oxide semiconductor layer 21 may contain an In—Ga—Zn—O based semiconductor, for example. The oxide semiconductor layer 21 is disposed on the second insulating layer IL2.

The second gate insulating layer GI2 is disposed on the oxide semiconductor layer 21. The second gate insulating layer GI2 is formed in the shape of an island, exclusively in a region that overlaps the second gate electrode 22.

The second gate electrode 22 is disposed on the second gate insulating layer GI2. The second gate electrode 22 is opposed to the oxide semiconductor layer 21 via the second gate insulating layer GI2. Although not shown, the second gate electrode 22 has a multilayer structure similar to that of the upper gate electrode 112 described above with reference to FIG. 1.

The second source electrode 23 and the second drain electrode 24 are electrically connected to the oxide semiconductor layer 21. The third insulating layer IL3 includes a portion that covers the oxide semiconductor layer 21, the second gate insulating layer GI2, and the second gate electrode 22, such that the second source electrode 23 and the second drain electrode 24 are disposed on the third insulating layer IL3. The second source electrode 23 and the second drain electrode 24 are connected to the oxide semiconductor layer 21 within a third contact hole CH3 and a fourth contact hole CH4, respectively, which are made in the third insulating layer IL3. As viewed from the normal direction of the substrate 101, each of the second source electrode 23 and the second drain electrode 24 does not overlap the second gate electrode 22.

On the third insulating layer IL3, a fourth insulating layer (passivation layer) IL4 is provided so as to cover the first source electrode 13, the first drain electrode 14, the second source electrode 23, and the second drain electrode 24.

As viewed from the normal direction of the substrate 1, the oxide semiconductor layer 21 includes a first portion that overlaps the second gate electrode 22, and second portions that are located between the first portion and the second source contact region or the second drain contact region. The second gate insulating layer GI2 covers the first portion, and yet does not cover the second portions.

As described earlier, each of the first TFT 10 and the second TFT 20 has a top gate structure.

Moreover, the active matrix substrate 100 includes gate bus lines (scanning lines) GL, source bus lines (signal lines) SL, pixel electrodes 30 and a common electrode 31.

The gate bus lines GL extend along the row direction, so as to be electrically connected to the second gate electrodes 22 of the second TFTs 20. In the example shown in the figure, a portion of each gate bus line GL that overlaps the oxide semiconductor layer 21 functions as a second gate electrode 22.

The source bus lines SL extend along the column direction, so as to be electrically connected to the second source electrodes 23 of the second TFTs 20. In the example shown in the figure, the second source electrode 23 extends from each source bus line SL.

The common electrode 31 is provided in common for the plurality of pixel regions P, and is given a potential that is common across the entire displaying region DR. In the present embodiment, a planarization layer 7 is provided on the fourth insulating layer IL4, such that the common electrode 31 is disposed on the planarization layer 7. The planarization layer 7 is made of an organic electrically insulative material (e.g., a photosensitive resin material).

The pixel electrodes 30 are provided respectively for the plurality of pixel regions P, so as to be electrically connected to the second drain electrodes 24 of the second TFTs 20. In the present embodiment, a dielectric layer 8 is provided so as to cover the common electrode 31, such that the pixel electrodes 30 are disposed on the dielectric layer 8. Each pixel electrode 30 is connected to the second drain electrode 24 in a pixel contact hole CHP that is made in the fourth insulating layer IL4, the planarization layer 7, and the dielectric layer 8. Each pixel electrode 30 has at least one (e.g., three in the example shown in FIG. 9) slit 30a.

The active matrix substrate 100 further includes a first light shielding layer 9a and a second light shielding layer 9b. The first light shielding layer 9a is disposed below the crystalline silicon semiconductor layer 11. As viewed from the normal direction of the substrate 101, the first light shielding layer 9a overlaps the crystalline silicon semiconductor layer 11. The second light shielding layer 9b is disposed below the oxide semiconductor layer 21. As viewed from the normal direction of the substrate 101, the second light shielding layer 9b overlaps the oxide semiconductor layer 21. The first light shielding layer 9a and the second light shielding layer 9b are covered by the basecoat layer 2.

Figure 10:
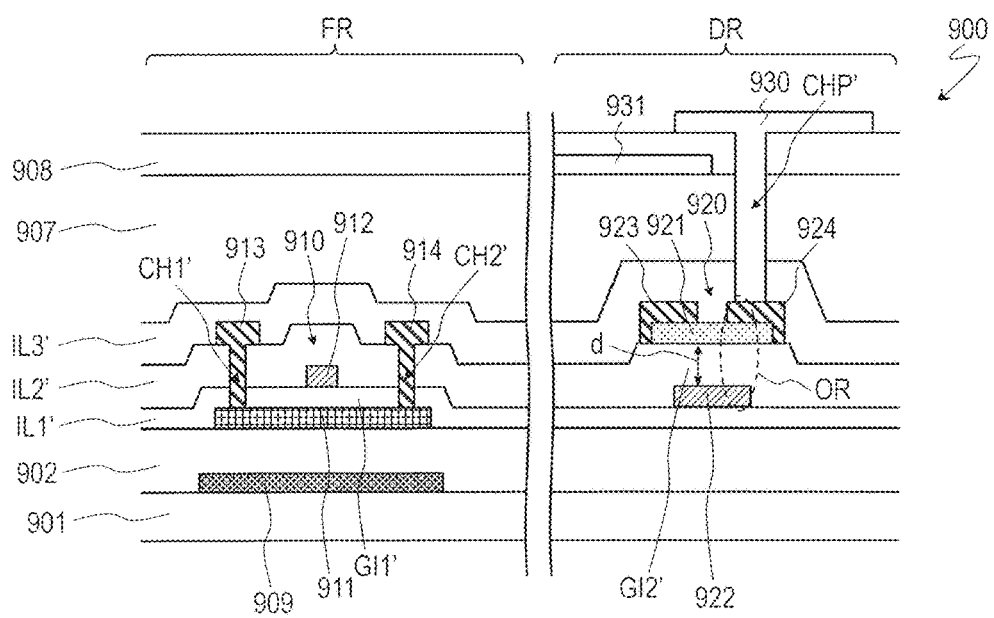
FIG. 10 A cross-sectional view showing an active matrix substrate 900 according to Comparative Example.
Figure 11:
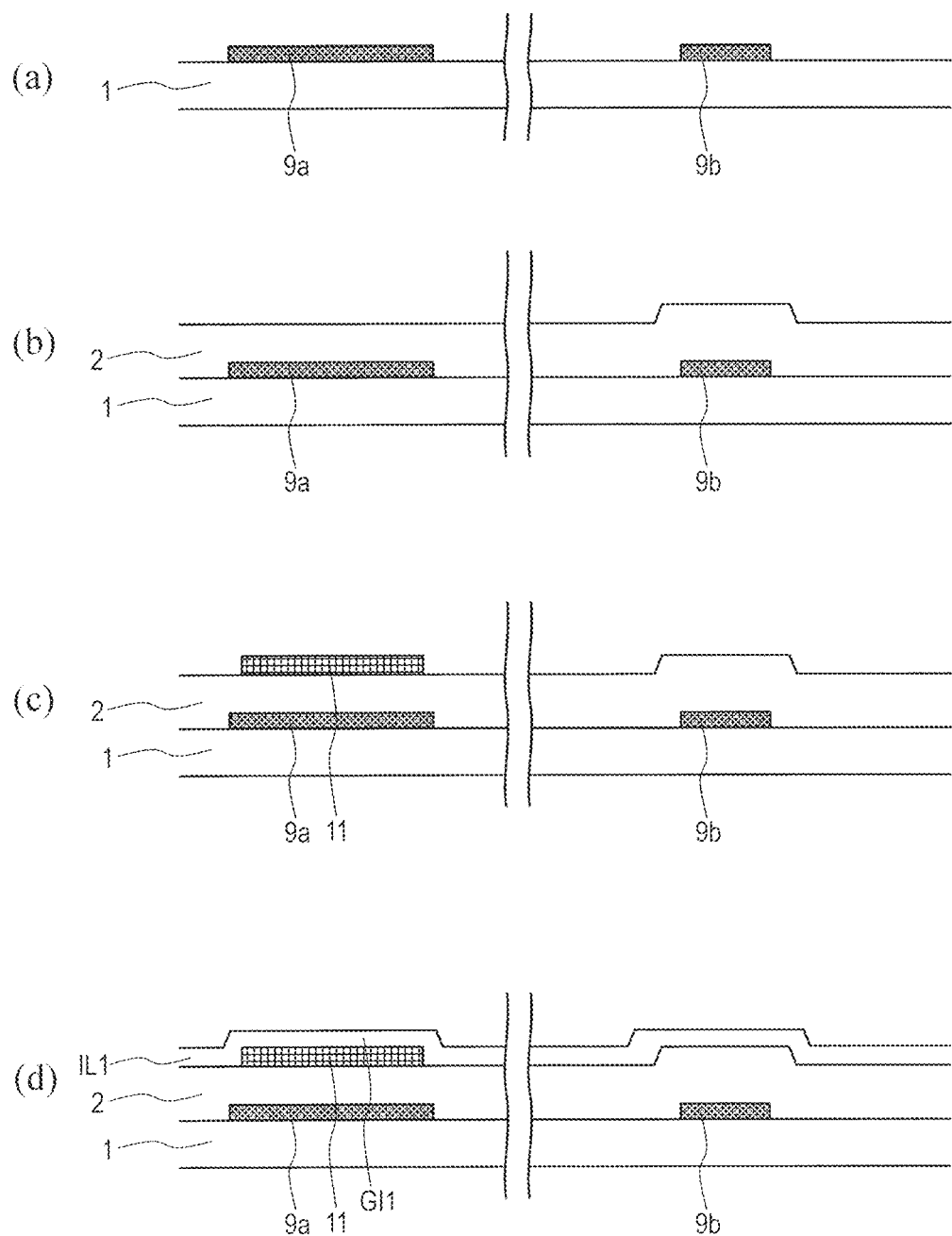
FIG. 11(a) through (d) are step-by-step cross-sectional views for describing a method of producing the active matrix substrate 100.
Figure 12:
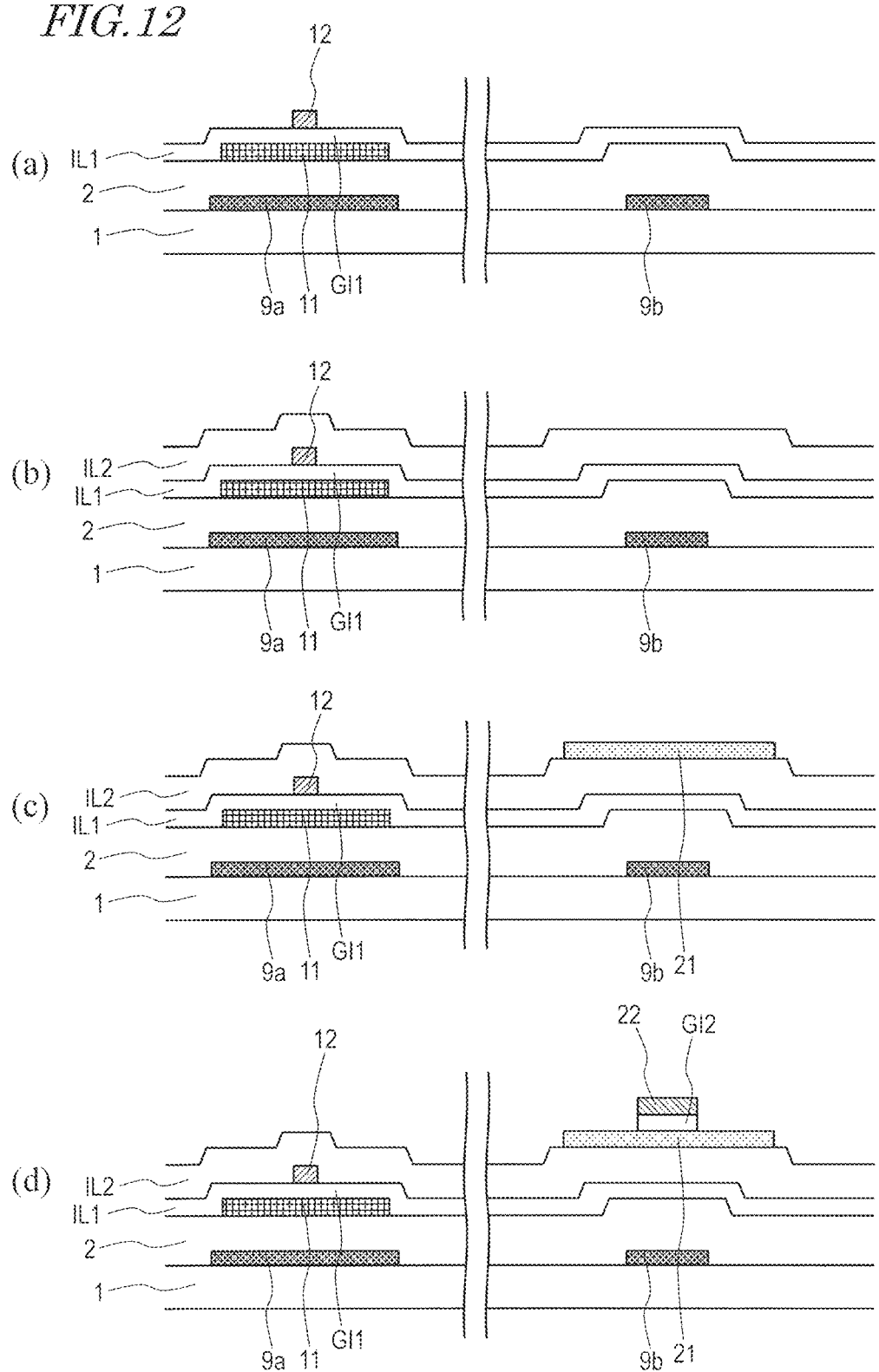
FIG. 12(a) through (d) are step-by-step cross-sectional views for describing a method of producing the active matrix substrate 100.
Figure 13:
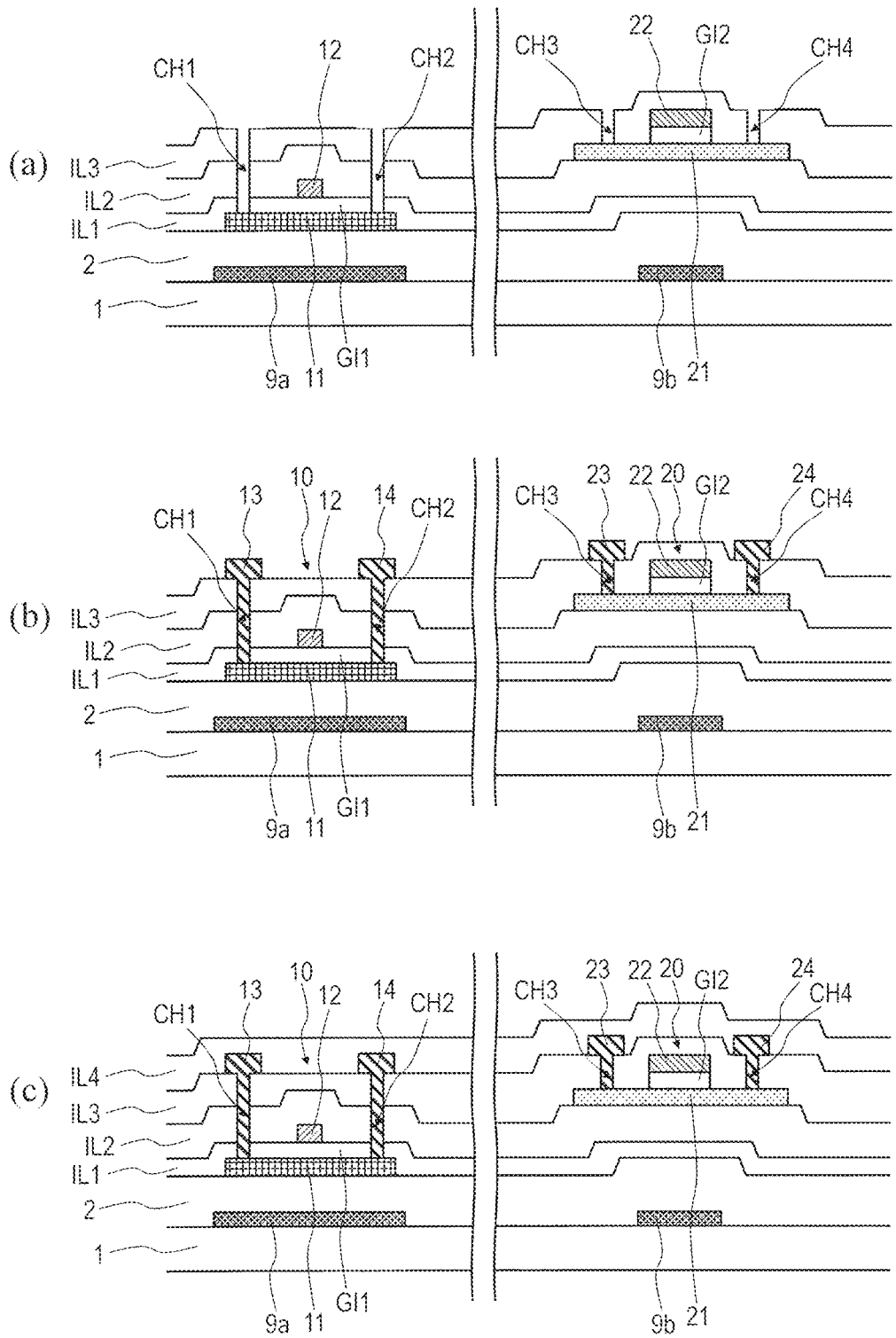
FIG. 13(a) through (c) are step-by-step cross-sectional views for describing a method of producing the active matrix substrate 100.
Figure 14:
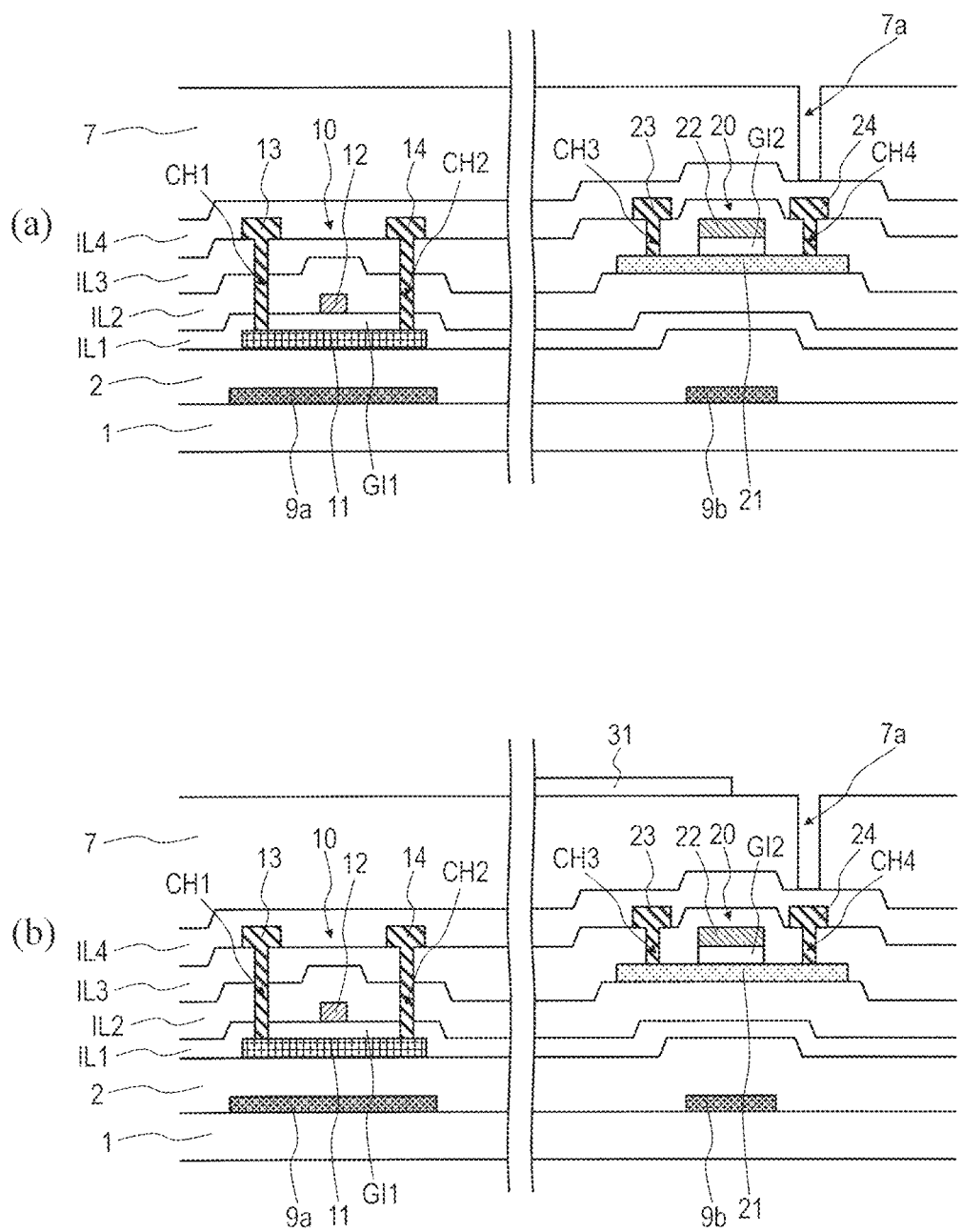
FIGS. 14(a) and (b) are step-by-step cross-sectional views for describing a method of producing the active matrix substrate 100.
Figure 15:
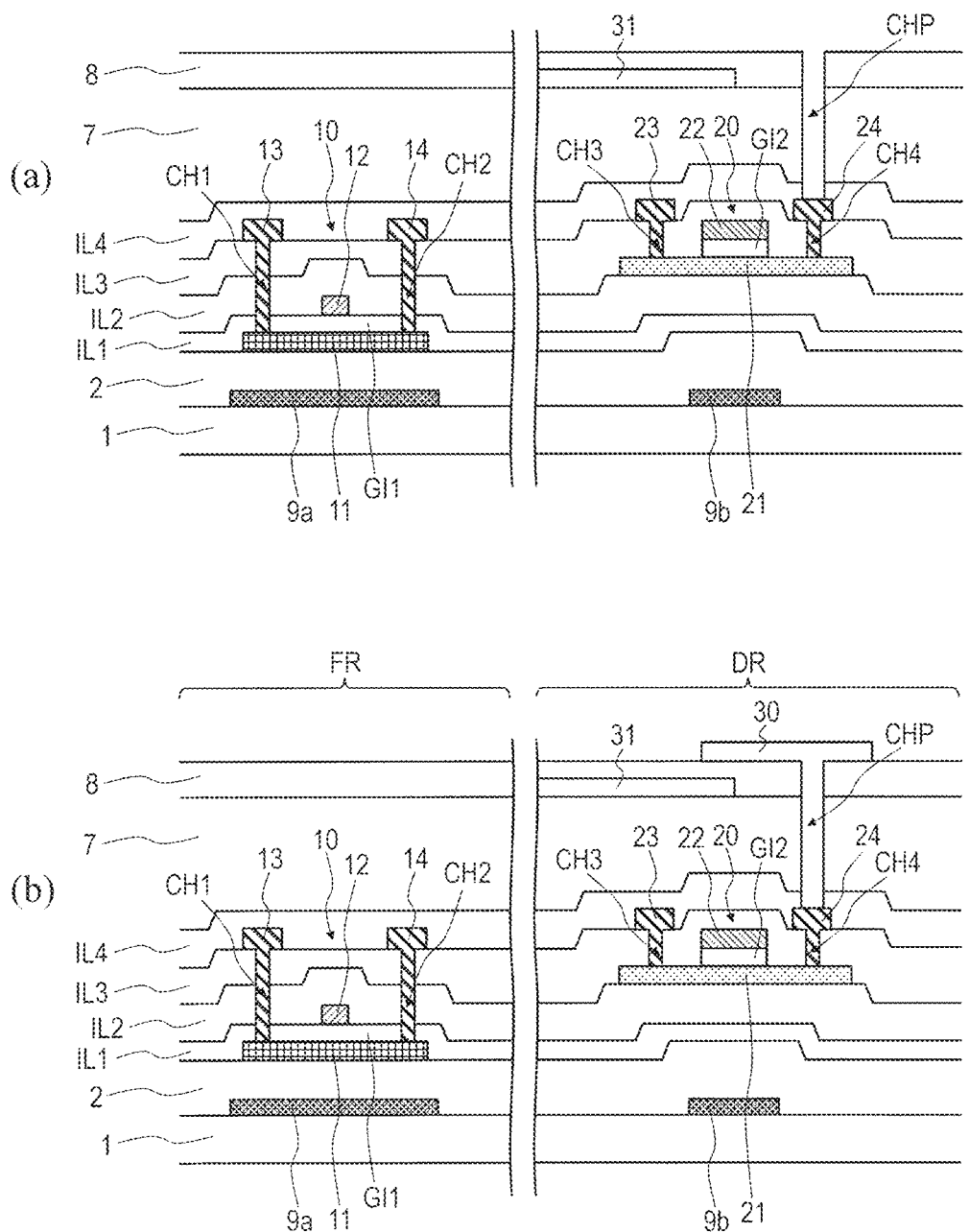
FIGS. 15(a) and (b) are step-by-step cross-sectional views for describing a method of producing the active matrix substrate 100.

Because of having the above-described construction, the active matrix substrate 100 according to the present embodiment is able to improve the current drivability of the pixel TFTs (second TFTs 20), without degrading the reliability of the circuit TFTs (first TFTs 10) or deteriorating the display quality. Hereinafter, the reasons thereof will be described in comparison with an active matrix substrate according to Comparative Example. FIG. 10 is a cross-sectional view showing an active matrix substrate 900 according to Comparative Example.

As shown in FIG. 10, the active matrix substrate 900 of Comparative Example includes a substrate 901 and a first TFT 910 and a second TFT 920 supported on the substrate 901. The first TFT 910 is disposed in the peripheral region FR. The second TFT 920 is disposed in the displaying region DR.

In the active matrix substrate 900 of Comparative Example, as will be described below, the first TFT 910 has a top gate structure, while the second TFT 920 has a bottom gate structure.

The first TFT 910, which is a crystalline silicon TFT that includes a crystalline silicon semiconductor layer 911 as an active layer, is a circuit TFT. In addition to the aforementioned crystalline silicon semiconductor layer 911, the first TFT 910 includes a first gate insulating layer GI1', a first gate electrode 912, a first source electrode 913, and a first drain electrode 914.

The crystalline silicon semiconductor layer 911 is formed on a basecoat layer 902, which in turn is formed on the substrate 901. Below the crystalline silicon semiconductor layer 911, a light shielding layer 909 is provided so as to overlap the crystalline silicon semiconductor layer 911. The first gate insulating layer GI1' is provided on the crystalline silicon semiconductor layer 911. More specifically, a first insulating layer IL1' that includes the first gate insulating layer GI1' is formed on the basecoat layer 902 and the crystalline silicon semiconductor layer 911, such that a part (i.e., a portion covering the crystalline silicon semiconductor layer 911) of the first insulating layer IL1' functions as the first gate insulating layer GI1'.

The first gate electrode 912 is provided on the first gate insulating layer GI1', so as to be opposed to the crystalline silicon semiconductor layer 911 via the first gate insulating layer GI1'. The first source electrode 913 and the first drain electrode 914 are electrically connected to the crystalline silicon semiconductor layer 911. On the first insulating layer IL1', a second insulating layer IL2' that includes a portion covering the first gate electrode 912 is provided, such that the first source electrode 913 and the first drain electrode 914 are disposed on the second insulating layer IL2'. The first source electrode 913 and the first drain electrode 914 are connected to the crystalline silicon semiconductor layer 911 within a first contact hole CH1' and a second contact hole CH2', respectively, which are made in the first insulating layer IL1' and the second insulating layer 112'.

The second TFT 920, which is an oxide semiconductor TFT that includes an oxide semiconductor layer 921 as an active layer, is a pixel TFT. In addition to the aforementioned oxide semiconductor layer 921, the second TFT 920 includes a second gate insulating layer GI2', a second gate electrode 922, a second source electrode 923, and a second drain electrode 924.

The second gate electrode 922 is disposed on the first insulating layer IL1'. The second gate electrode 922 is covered by the second insulating layer IL2'. A portion of the second insulating layer IL2' that covers the second gate electrode 922 functions as the second gate insulating layer GI2'.

The oxide semiconductor layer 921 is disposed on the second gate insulating layer GI2', and is opposed to the second gate electrode 922 via the second gate insulating layer GI2'. The second source electrode 923 and the second drain electrode 924 are disposed so as to be each in contact with the upper face of the oxide semiconductor layer 921.

On the second insulating layer IL2', a third insulating layer IL3' is provided so as to cover the first source electrode 913, the first drain electrode 914, the second source electrode 923, and the second drain electrode 924.

A planarization layer 907 is provided on the third insulating layer IL3', and a common electrode 931 is provided on the planarization layer 907. A dielectric layer 908 is provided so as to cover the common electrode 931, and a pixel electrode 930 is provided on the dielectric layer 908. The pixel electrode 930 is connected to the second drain electrode 924 within a pixel contact hole CHP' which is made in the third insulating layer IL3', the planarization layer 907, and the dielectric layer 908.

As described above, in the active matrix substrate 900 of Comparative Example, the first TFT 910 being a circuit TFT has a top gate structure, whereas the second TFT 920 being a pixel TFT has a bottom gate structure. In the second TFT 920 having a bottom gate structure, the second gate insulating layer GI2' has a large thickness d for the sake of a breakdown voltage between source-gate, as a result of which the current drivability will be degraded.

By increasing the gate voltage Vg (i.e., increasing the high-level potential Vgh of the gate signal), it is possible to increase the ON current Ion of the second TFT 920, i.e., enhance current drivability. However, the first TFT 910 being a circuit TFT is a crystalline silicon TFT, and has a low breakdown voltage. Therefore, when a high high-level potential Vgh is supplied as the gate voltage Vg, the leak current may increase, or the reliability may be lowered.

Moreover, in order to take factors such as accuracy of alignment into account, the second TFT 920 having a bottom gate structure is designed so that there exists a region (a region OR surrounded by a dotted line in FIG. 10) where the second drain electrode 924 and the second gate electrode 922 overlap as viewed from the substrate normal direction. Therefore, the gate-drain capacitance Cgd is relatively large, and there is a large variation in the gate-drain capacitance Cgd. As a result, there is a substantial in-plane distribution of flicker, whereby the display quality is deteriorated.

As described above, in the active matrix substrate 900 of Comparative Example, trying to improve the current drivability of the pixel TFT (second TFT 920) will result in a deteriorated reliability and display quality of the circuit TFT (first TFT 910).

On the other hand, in the active matrix substrate 100 according to the present embodiment, each of the first TFT 10 and the second TFT 20 has a top gate structure. In other words, not only the first TFT 10 being a circuit TFT but also the second TFT 20 being a pixel TFT has a top gate structure.

When the second TFT 20 has a top gate structure, there exists no region where the second gate electrode 22 and the second source electrode 23 overlap via nothing but the second gate insulating layer GI2; therefore, the thickness of the second gate insulating layer GI2 can be reduced. Therefore, the current drivability of the second TFT 20 can be enhanced. Moreover, since the second gate electrode 22 and the second drain electrode 24 do not need to be in an overlapping arrangement, the gate-drain parasitic capacitance Cgd can be reduced. As a result, the in-plane distribution of flicker can be greatly reduced, whereby deteriorations in display quality can be suppressed.

In the case where the second light shielding layer 9b is made of an electrically conductive material, the second light shielding layer 9b may be electrically connected to the second gate electrode 22. As a result, the gate voltage that is applied to the second gate electrode 22 will also be applied to the second light shielding layer 9b, so that the second light shielding layer 9b can be allowed to function as a further gate electrode (backgate electrode) of the second TFT 20. Thus, the ON current of the second TFT 20 can be further increased and the current drivability can be further improved. In the case where the second light shielding layer 9b is electrically connected to the second gate electrode 22, it is preferable that the oxide semiconductor layer 21 does not have a multilayer structure (i.e., be a single layer).

Now, an exemplary method of producing the active matrix substrate 100 will be described. FIG. 11 to FIG. 15 are step-by-step cross-sectional views for describing a method of producing the active matrix substrate 100.

First, as shown in FIG. 11(a), a first light shielding layer 9a and a second light shielding layer 9b are formed on a substrate 1. Specifically, after depositing a light shielding film on the substrate 1, the light shielding film may be patterned, thereby forming the first light shielding layer 9a and the second light shielding layer 9b. The material of the light shielding film may be an MoW alloy, for example. The thicknesses of the first light shielding layer 9a and the second light shielding layer 9b may be e.g. not less than 50 nm and not more than 500 nm.

Next, as shown in FIG. 11(b), a basecoat layer 2 is formed so as to cover the substrate 1, the first light shielding layer 9a, and the second light shielding layer 9b. For example, the basecoat layer 2 may have a multilayer structure including a silicon nitride (SiNx) layer as a lower layer and a silicon oxide (SiOx) layer as an upper layer; however, of course, this is not a limitation.

Then, as shown in FIG. 11(c), a crystalline silicon semiconductor layer 11 (which herein is a polycrystalline silicon layer) is formed on the basecoat layer 2. Specifically, first, an amorphous silicon (a-Si) film is deposited on the basecoat layer 2, and then the amorphous silicon film is crystallized, thereby forming a polycrystalline silicon film. Deposition of the amorphous silicon film can be achieved by plasma CVD, sputtering, etc., for example. Crystallization of the amorphous silicon film can be achieved by excimer laser irradiation, for example. Then, the polycrystalline silicon film may be patterned to form the crystalline silicon semiconductor layer 11 in an island shape. The thickness of the crystalline silicon semiconductor layer 11 may be e.g. not less than 30 nm and not more than 100 nm.

Thereafter, as shown in FIG. 11(d), a first insulating layer IL1 that includes a first gate insulating layer GI1 is formed so as to cover the basecoat layer 2 and the crystalline silicon semiconductor layer 11. The first insulating layer IL1 may be a silicon oxide (SiOx) layer, for example. The thickness of the first insulating layer IL1 may be e.g. not less than 50 nm and not more than 200 nm.

Next, as shown in FIG. 12(a), a first gate electrode 12 is formed on the first insulating layer IL1, so as to be opposed to the crystalline silicon semiconductor layer 11 via the first insulating layer IL1. Specifically, after an electrically conductive film for the gate is deposited on the first insulating layer IL1, the electrically conductive film for the gate may be patterned to form the first gate electrode 12. As the material of the electrically conductive film for the gate, for example, metals such as molybdenum (Mo), tungsten (W), aluminum (Al), copper (Cu), titanium (Ti), and tantalum (Ta), or an alloy thereof, can be used. Moreover, the first gate electrode 12 may have a multilayer structure including a plurality of layers that are made of different electrically conductive materials. The thickness of the first gate electrode 12 may be e.g. not less than 50 nm and not more than 500 nm.

Then, by using the first gate electrode 12 as a mask, an impurity is implanted in the crystalline silicon semiconductor layer 11 to form a source region and a drain region. The region of the crystalline silicon semiconductor layer 11 where the impurity was not implanted becomes a channel region (active region).

Thereafter, as shown in FIG. 12(b), a second insulating layer IL2 is formed so as to cover the first insulating layer IL1 and the first gate electrode 12. The second insulating layer IL2 may be a silicon oxide layer (SiOx) layer, a silicon nitride (SiNx) layer, or a silicon oxynitride (SiNxOy) layer, for example. The thickness of the second insulating layer IL2 may be e.g. not less than 150 nm and not more than 500 nm.

Next, as shown in FIG. 12(c), an oxide semiconductor layer 21 is formed on the second insulating layer IL2. Specifically, after an oxide semiconductor film is deposited on the second insulating layer IL2, the oxide semiconductor film may be patterned to form the oxide semiconductor layer 21. The thickness of the oxide semiconductor layer 21 may be e.g. not less than 10 nm and not more than 150 nm.

Then, as shown in FIG. 12(d), a second gate insulating layer GI2 and a second gate electrode 22 are formed on the oxide semiconductor layer 21. Specifically, first, an insulating film is deposited so as to cover the oxide semiconductor layer 21, and then an electrically conductive film for the gate is deposited thereon. Next, the electrically conductive film for the gate is patterned by using a resist mask, thereby forming the second gate electrode 22. Thereafter, by using the same resist mask as for the second gate electrode 22, a portion of the gate insulating film which is not covered by the second gate electrode 22 is removed, whereby the second gate insulating layer GI2 can be formed. The second gate insulating layer GI2 may be a silicon oxide (SiOx) layer, for example. The thickness of the second gate insulating layer GI2 may be e.g. from not less than 90 nm to 200 nm. The material of the electrically conductive film for the gate (multilayer film) to become the second gate electrode 22 may be the same as the material of the aforementioned second electrically conductive film 112'. The thickness of the second gate electrode 22 may be e.g. not less than 30 nm and not more than 500 nm. Thereafter, the resist mask is removed with a remover. At this time, as in the earlier-described embodiment, a first metallic element M that is contained in the remover becomes admixed into the portion of the oxide semiconductor layer 21 that is not covered by the second gate insulating layer GI2.

Next, as shown in 13(a), a third insulating layer IL3 is formed so as to cover the oxide semiconductor layer 21, the second gate insulating layer GI2, and the second gate electrode 22. The third insulating layer IL3 may be a silicon oxide (SiOx) layer, a silicon nitride (SiNx) layer, or a silicon oxynitride (SiNxOy) layer for example. Moreover, the third insulating layer IL3 may have a multilayer structure in which such layers are stacked. The thickness of the third insulating layer IL3 may be e.g. not less than 150 nm and not more than 500 nm. Thereafter, a first contact hole CH1 and a second contact hole CH2 are made in the first insulating layer IL1, the second insulating layer IL2, and the third insulating layer IL3, so that parts (a source region and a drain region) of the crystalline silicon semiconductor layer 11 will be exposed. Moreover, a third contact hole CH3 and a fourth contact hole CH4 are made in the third insulating layer IL3 so that parts (a source contact region and a drain contact region) of the oxide semiconductor layer 21 will be exposed.

Then, as shown in FIG. 13(b), on the third insulating layer IL3, a first source electrode 13, a first drain electrode 14, a second source electrode 23, and a second drain electrode 24 are formed. Specifically, after an electrically conductive film for the source/drain is deposited on the third insulating layer IL3, the electrically conductive film for the source/drain may be patterned to form the first source electrode 13, the first drain electrode 14, the second source electrode 23, and the second drain electrode 24. As the material of the electrically conductive film for the source/drain, for example, metals such as molybdenum (Mo), tungsten (W), aluminum (Al), copper (Cu), titanium (Ti), and tantalum (Ta), or an alloy thereof, can be used. The thicknesses of the first source electrode 13, the first drain electrode 14, the second source electrode 23, and the second drain electrode 24 may be e.g. not less than 100 nm and not more than 500 nm.

Thereafter, as shown in FIG. 13(c), a fourth insulating layer IL4 that covers the third insulating layer IL3, the first source electrode 13, the first drain electrode 14, the second source electrode 23, and the second drain electrode 24 is formed. The fourth insulating layer IL4 may be a silicon nitride (SiNx) layer, for example. The thickness of the fourth insulating layer IL4 may be e.g. not less than 100 nm and not more than 500 nm.

Next, as shown in FIG. 14(a), a planarization layer is formed on the fourth insulating layer IL4. The planarization layer 7 may be made of a photosensitive resin material, for example. The thickness of the planarization layer 7 may be e.g. not less than 1.5 μm and not more than 3.0 μm. An aperture 7a is made in a region of the planarization layer 7 to later become a pixel contact hole CHP.

Then, as shown in FIG. 14(b), a common electrode 31 is formed on the planarization layer 7. Specifically, after depositing a transparent electrically conductive film on the planarization layer 7, the transparent electrically conductive film may be patterned to form the common electrode 31. As the material of the transparent electrically conductive film, ITO can be used, for example. The thickness of the common electrode 31 may be e.g. not less than 40 nm and not more than 150 nm.

Next, as shown in FIG. 15(a), a dielectric layer 8 is formed so as to cover the planarization layer 7 and the common electrode 31. The dielectric layer 8 may be a silicon nitride (SiNx) layer, for example. The thickness of the dielectric layer 8 may be e.g. not less than 100 nm and not more than 400 nm. Then, an aperture is made in regions of the dielectric layer 8 and the fourth insulating layer IL4 to become the pixel contact hole CHP, thus forming the pixel contact hole CHP.

Thereafter, as shown in FIG. 15(b), a pixel electrode 30 is formed on the dielectric layer 8. Specifically, after a transparent electrically conductive film is deposited on the dielectric layer 8, the transparent electrically conductive film may be patterned to form the pixel electrode 30. As the material of the transparent electrically conductive film, ITO can be use, for example. The thickness of the pixel electrode 30 may be e.g. not less than 40 nm and not more than 150 nm. In this manner, the active matrix substrate 100 can be obtained.

Embodiment 3

Figure 16:
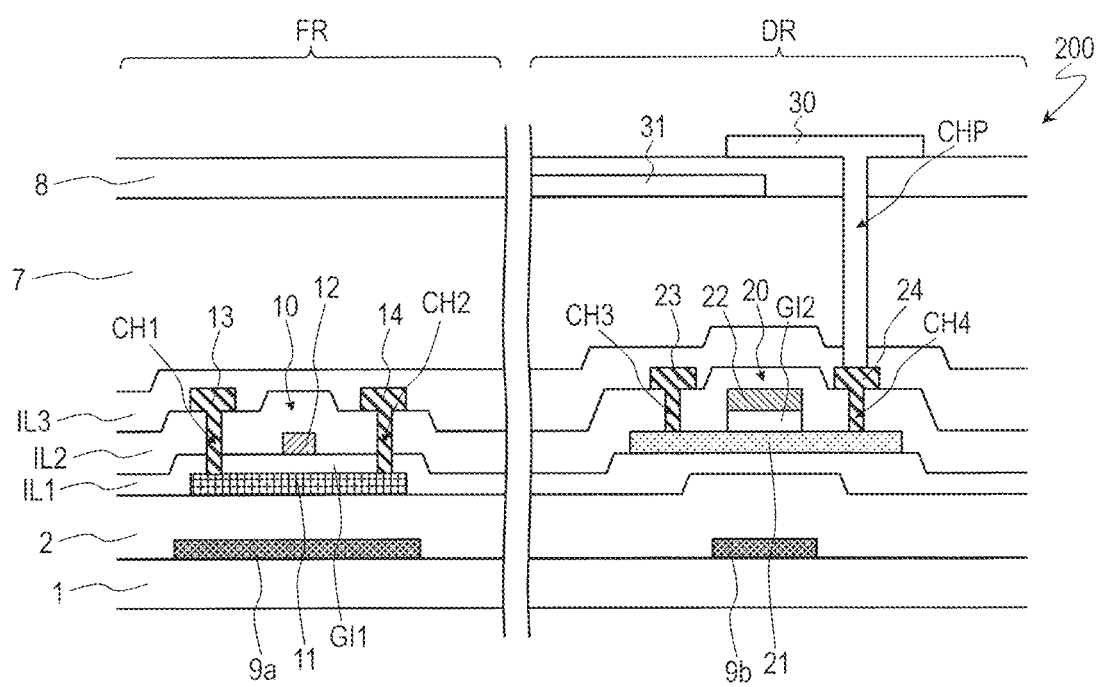
FIG. 16 A cross-sectional view schematically showing an active matrix substrate 200 according to an embodiment of the present invention.

With reference to FIG. 16, an active matrix substrate 200 according to the present embodiment will be described. FIG. 16 is a cross-sectional view schematically showing the active matrix substrate 200.

The active matrix substrate 200 according to the present embodiment differs from the active matrix substrate 100 according to Embodiment 2 with respect to the number of insulating layers being stacked. In the active matrix substrate 100 according to Embodiment 2, five insulating layers are stacked between the basecoat layer 2 and the planarization layer 7, specifically: the first insulating layer IL1 (including the first gate insulating layer GI1), the second insulating layer IL2, the second gate insulating layer GI2, the third insulating layer IL3, and the fourth insulating layer IL4. On the other hand, in the active matrix substrate 200 according to the present embodiment, as will be described later, four insulating layers are stacked between a basecoat layer 2 and a planarization layer 7, specifically: a first insulating layer IL1 (including a first gate insulating layer GI1), a second gate insulating layer GI2, a second insulating layer IL2, and a third insulating layer IL3.

As shown in FIG. 16, the active matrix substrate 200 includes a first TFT 10 which is a circuit TFT disposed in a peripheral region FR and a second TFT 20 which is a pixel TFT disposed in a displaying region DR.

The first TFT 10 is a crystalline silicon TFT that includes a crystalline silicon semiconductor layer 11 as an active layer. In addition to the crystalline silicon semiconductor layer 11, the first TFT 10 includes a first gate insulating layer GI1, a first gate electrode 12, a first source electrode 13, and a first drain electrode 14.

The crystalline silicon semiconductor layer 11 is disposed on the basecoat layer 2. The first gate insulating layer GI1 is disposed on the crystalline silicon semiconductor layer 11. The first insulating layer IL1, including the first gate insulating layer GI1, is formed on the basecoat layer 2 and the crystalline silicon semiconductor layer 11, such that a part (i.e., a portion covering the crystalline silicon semiconductor layer 11) of the first insulating layer IL1 functions as the first gate insulating layer GI1.

The first gate electrode 12 is disposed on the first gate insulating layer GI1. The first gate electrode 12 is opposed to the crystalline silicon semiconductor layer 11 via the first gate insulating layer GI1.

The first source electrode 13 and the first drain electrode 14 are electrically connected to the crystalline silicon semiconductor layer 11. In the present embodiment, a second insulating layers IL2 that includes a portion covering the first gate electrode 12 is provided on the first insulating layer IL1. The first source electrode 13 and the first drain electrode 14 are disposed on the second insulating layer IL2. The first source electrode 13 and the first drain electrode 14 are connected to the crystalline silicon semiconductor layer 11 within a first contact hole CH1 and a second contact hole CH2, respectively, which are made in the first insulating layer IL1 (first gate insulating layer GI1) and the second insulating layer IL2.

The second TFT 20 is an oxide semiconductor TFT that includes an oxide semiconductor layer 21 as an active layer. In addition to the oxide semiconductor layer 21, the second TFT 20 includes a second gate insulating layer GI2, a second gate electrode 22, a second source electrode 23, and a second drain electrode 24.

The oxide semiconductor layer 21 is disposed on the first insulating layer IL1. The second gate insulating layer GI2 is disposed on the oxide semiconductor layer 21. The second gate insulating layer GI2 is formed in the shape of an island, exclusively in a region that overlaps the second gate electrode 22.

The second gate electrode 22 is disposed on the second gate insulating layer GI2. The second gate electrode 22 is opposed to the oxide semiconductor layer 21 via the second gate insulating layer GI2. The second gate electrode 22 has a multilayer structure similar to that of the upper gate electrode 112 described above with reference to FIG. 1.

The second source electrode 23 and the second drain electrode 24 are electrically connected to the oxide semiconductor layer 21. The second insulating layer IL2 includes a portion that covers the oxide semiconductor layer 21, the second gate insulating layer GI2, and the second gate electrode 22, such that the second source electrode 23 and the second drain electrode 24 are disposed on the second insulating layer IL2. The second source electrode 23 and the second drain electrode 24 are connected to the oxide semiconductor layer 21 within a third contact hole CH3 and a fourth contact hole CH4, respectively, which are made in the second insulating layer IL2. As viewed from the normal direction of the substrate 101, each of the second source electrode 23 and the second drain electrode 24 does not overlap the second gate electrode 22.

On the second insulating layer IL2, a third insulating layer IL3 is disposed so as to cover the first source electrode 13, the first drain electrode 14, the second source electrode 23, and the second drain electrode 24.

As described earlier, each of the first TFT 10 and the second TFT 20 has a top gate structure.

The planarization layer 7 is disposed on the third insulating layer IL3, and a common electrode 31 is provided on the planarization layer 7. A dielectric layer 8 is provided so as to cover the common electrode 31, such that the pixel electrode 30 is disposed on the dielectric layer 8. The pixel electrode 30 is connected to the second drain electrode 24 within a pixel contact hole CHP which is made in the third insulating layer IL3, the planarization layer 7, and the dielectric layer 8.

Below the crystalline silicon semiconductor layer 11, a first light shielding layer 9a is provided so as to overlap the crystalline silicon semiconductor layer 11 as viewed from the normal direction of the substrate 101. Below the oxide semiconductor layer 21, a second light shielding layer 9b is provided so as to overlap the oxide semiconductor layer 21 as viewed from the normal direction of the substrate 101.

In the active matrix substrate 200 according to the present embodiment, too, since each of the first TFT 10 and the second TFT 20 has a top gate structure, current drivability of the pixel TFT (second TFT 20) can be improved without degrading the reliability of the circuit TFTs (first TFTs 10) or deteriorating the display quality, as is the case with the active matrix substrate 100 according to Embodiment 2.

Moreover, the active matrix substrate 200 according to the present embodiment has a smaller number of insulating layers being stacked than in the active matrix substrate 100 according to Embodiment 2, and thus the number of production steps can be reduced, whereby the production cost can be decreased.

Similarly to the active matrix substrate 100 according to Embodiment 2, in the active matrix substrate 200 according to the present embodiment, too, the second light shielding layer 9b may be electrically connected to the second gate electrode 22 in the case where the second light shielding layer 9b is made of an electrically conductive material. This will allow the second light shielding layer 9b to function as a further gate electrode (backgate electrode) of the second TFT 20. Thus, the ON current of the second TFT 20 can be further increased and the current drivability can be further improved.

Figure 17:
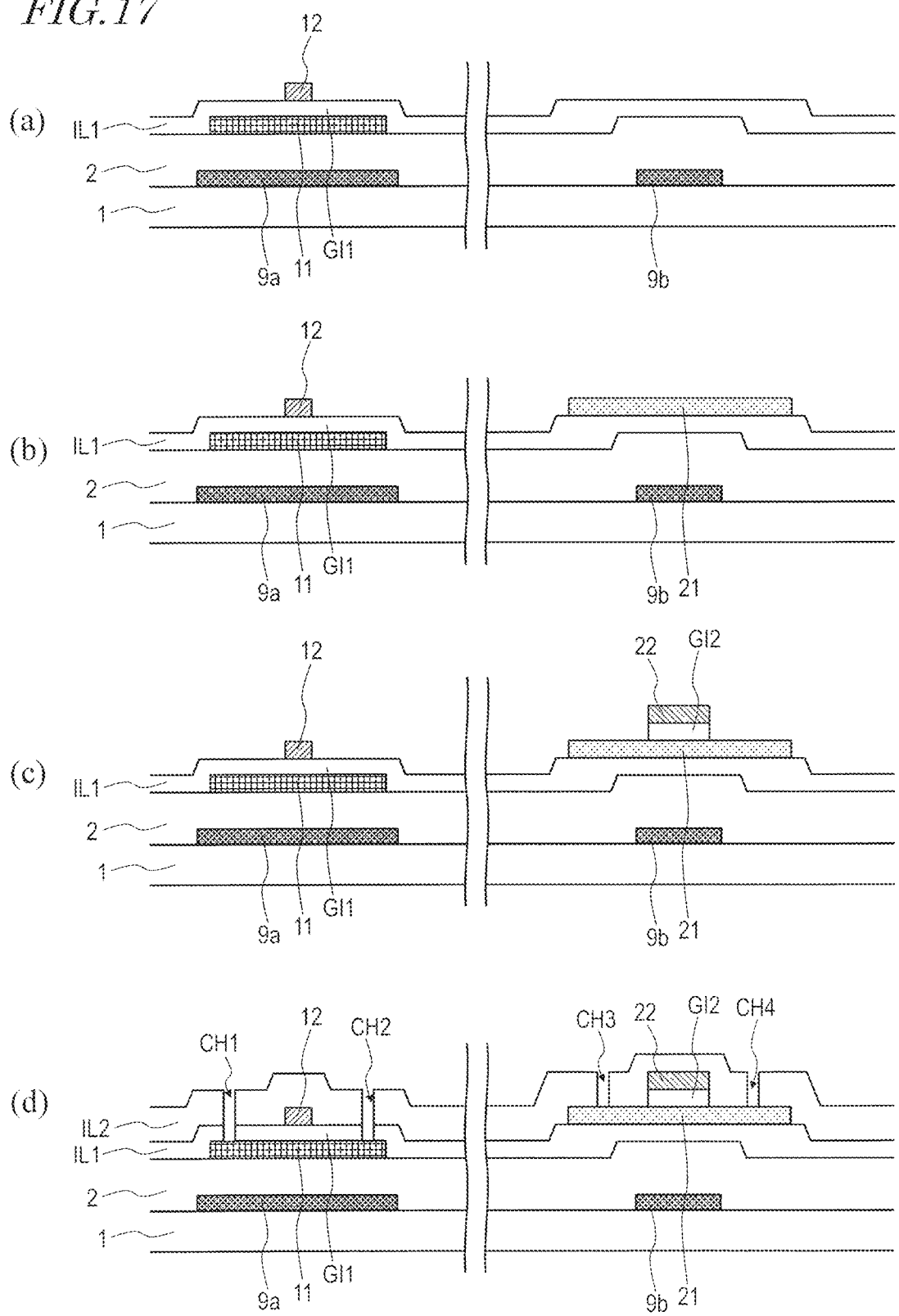
FIG. 17(a) through (d) are step-by-step cross-sectional views for describing a method of producing the active matrix substrate 200.
Figure 18:
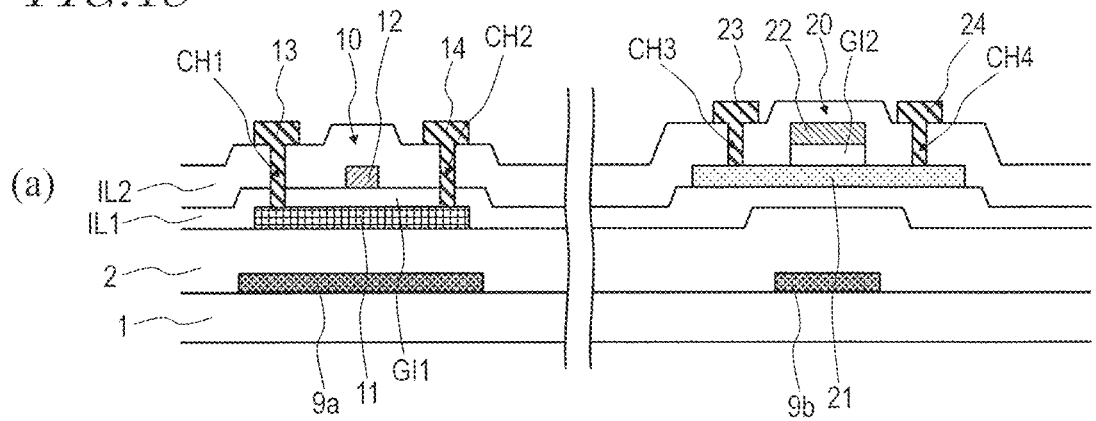
FIG. 18(a) through (c) are step-by-step cross-sectional views for describing a method of producing the active matrix substrate 200.
Figure 18:
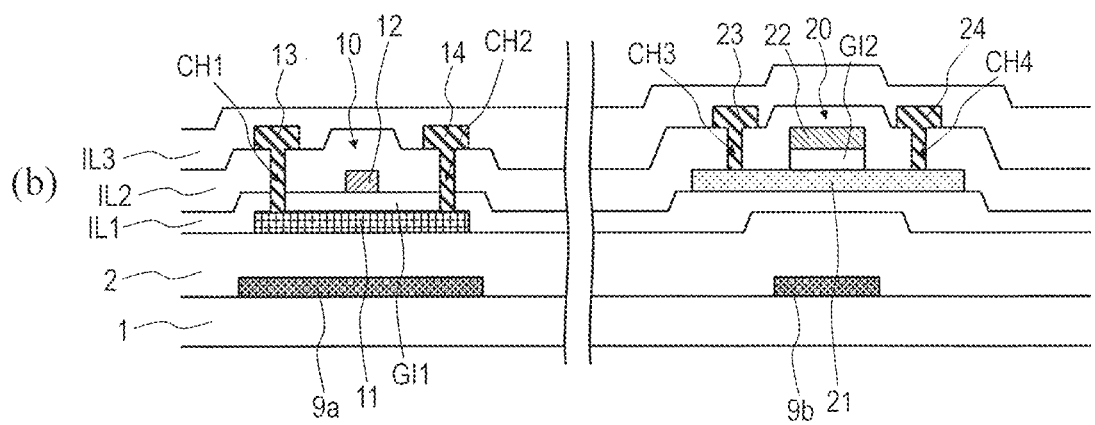
Figure 18:
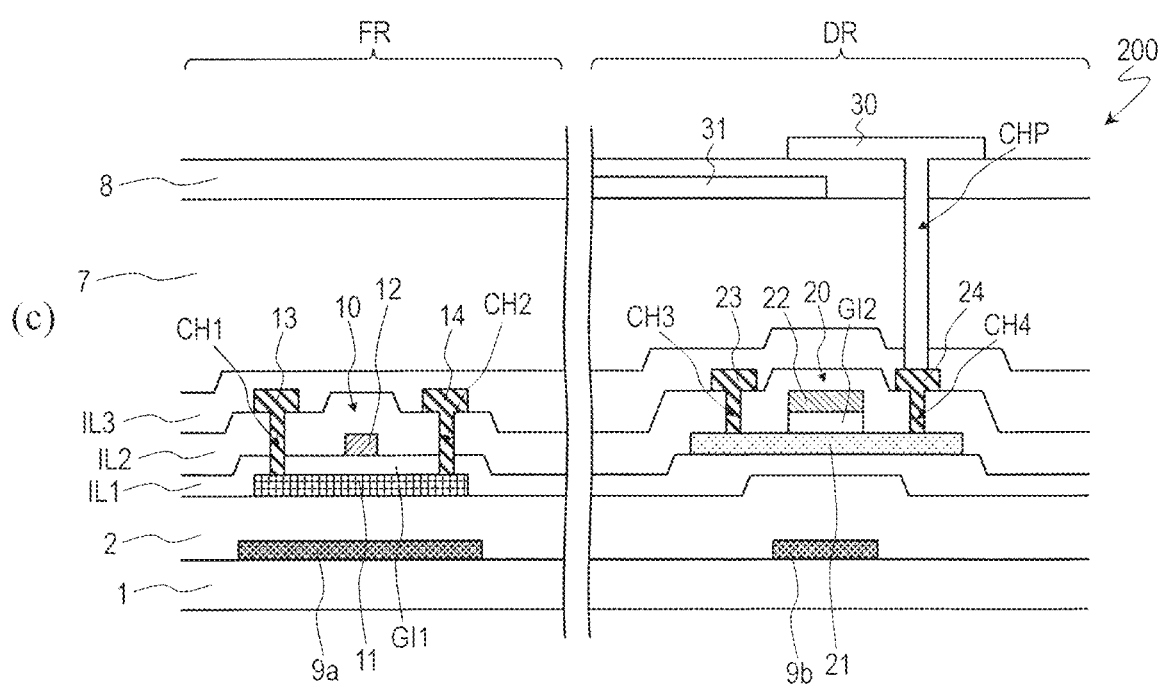

Now, an exemplary method of producing the active matrix substrate 200 will be described. FIG. 17 and FIG. 18 are step-by-step cross-sectional views for describing a method of producing the active matrix substrate 200.

First, as shown in FIG. 17(a), a first light shielding layer 9a, a second light shielding layer 9b, a basecoat layer 2, a crystalline silicon semiconductor layer 11, a first insulating layer IL1 (including a first gate insulating layer GI1) and a first gate electrode 12 are sequentially formed on a substrate 1. These steps can be performed similarly to the steps which have been described in connection with the active matrix substrate 100 according to Embodiment 2 with reference to FIG. 11(a) through FIG. 12(a). Thereafter, by using the first gate electrode 12 as a mask, an impurity is implanted in the crystalline silicon semiconductor layer 11 to form a source region and a drain region. The region of the crystalline silicon semiconductor layer 11 where the impurity was not implanted becomes a channel region (active region).

Next, as shown in FIG. 17(b), an oxide semiconductor layer 21 is formed on the first insulating layer IL1. Specifically, after an oxide semiconductor film is deposited on the first insulating layer ILL the oxide semiconductor film may be patterned to form the oxide semiconductor layer 21. The thickness of the oxide semiconductor layer 21 may be e.g. not less than 10 nm and not more than 15 nm.

Then, as shown in FIG. 17(c), a second gate insulating layer GI2 and a second gate electrode 22 are formed on the oxide semiconductor layer 21. Specifically, first, an insulating film is deposited so as to cover the oxide semiconductor layer 21, and then an electrically conductive film for the gate is deposited thereon. Next, the electrically conductive film for the gate is patterned by using a resist mask, thereby forming the second gate electrode 22. Thereafter, by using the same resist mask as for the second gate electrode 22, a portion of the insulating film which is not covered by the second gate electrode 22 is removed, whereby the second gate insulating layer GI2 can be formed. The second gate insulating layer GI2 may be a silicon oxide (SiOx) layer, for example. The thickness of the second gate insulating layer GI2 may be e.g. from not less than 90 nm to 200 nm. The material of the electrically conductive film for the gate (multilayer film) to become the second gate electrode 22 may be the same material as that of the aforementioned second electrically conductive film 112'. The thickness of the second gate electrode 22 may be e.g. not less than 30 nm and not more than 500 nm. Thereafter, the resist mask is removed with a remover. At this time, as in the earlier-described embodiment, a first metallic element M that is contained in the remover becomes admixed into the portion of the oxide semiconductor layer 21 that is not covered by the second gate insulating layer GI2.

Thereafter, as shown in FIG. 17(d), a second insulating layer IL2 is formed so as to cover the first gate electrode 12, the oxide semiconductor layer 21, the second gate insulating layer GI2, and the second gate electrode 22. The second insulating layer IL2 may be a silicon oxide (SiOx) layer, a silicon nitride (SiNx) layer, or a silicon oxynitride (SiNxOy) layer, for example. Moreover, the second insulating layer IL2 may have a multilayer structure in which such layers are stacked. The thickness of the second insulating layer IL2 may be e.g. not less than 150 nm and not more than 500 nm. Thereafter, a first contact hole CH1 and a second contact hole CH2 are made in the first insulating layer IL1 and the second insulating layer IL2 so that parts (a source region and a drain region) of the crystalline silicon semiconductor layer 11 will be exposed. Moreover, a third contact hole CH3 and a fourth contact hole CH4 are made in the second insulating layer IL2 so that parts (a source contact region and a drain contact region) of the oxide semiconductor layer 21 will be exposed.

Next, as shown in FIG. 18(a), a first source electrode 13, a first drain electrode 14, a second source electrode 23, and a second drain electrode 24 are formed on the second insulating layer IL2. Specifically, after an electrically conductive film for the source/drain is deposited on the second insulating layer IL2, the electrically conductive film for the source/drain may be patterned to form the first source electrode 13, the first drain electrode 14, the second source electrode 23, and the second drain electrode 24. As the material of the electrically conductive film for the source/drain, for example, metals such as molybdenum (Mo), tungsten (W), aluminum (Al), copper (Cu), titanium (Ti), and tantalum (Ta), or an alloy thereof, can be used. The thicknesses of the first source electrode 13, the first drain electrode 14, the second source electrode 23, and the second drain electrode 24 may be e.g. not less than 100 nm and not more than 500 nm.

Then, as shown in FIG. 18(b), a third insulating layer IL3 that covers the second insulating layer IL2, the first source electrode 13, the first drain electrode 14, the second source electrode 23, and the second drain electrode 24 is formed. The third insulating layer IL3 may be a silicon nitride (SiNx) layer, for example. The thickness of the third insulating layer IL3 may be e.g. not less than 100 nm and not more than 500 nm.

Thereafter, as shown in FIG. 18(c), a planarization layer 7, a common electrode 31, a dielectric layer 8, and a pixel electrode 30 are sequentially formed on the third insulating layer IL3. These steps can be performed similarly to the steps which have been described in connection with the active matrix substrate 100 according to Embodiment 2 with reference to FIG. 14(a) through FIG. 15(b). In this manner, the active matrix substrate 200 can be obtained.

Figure 19:
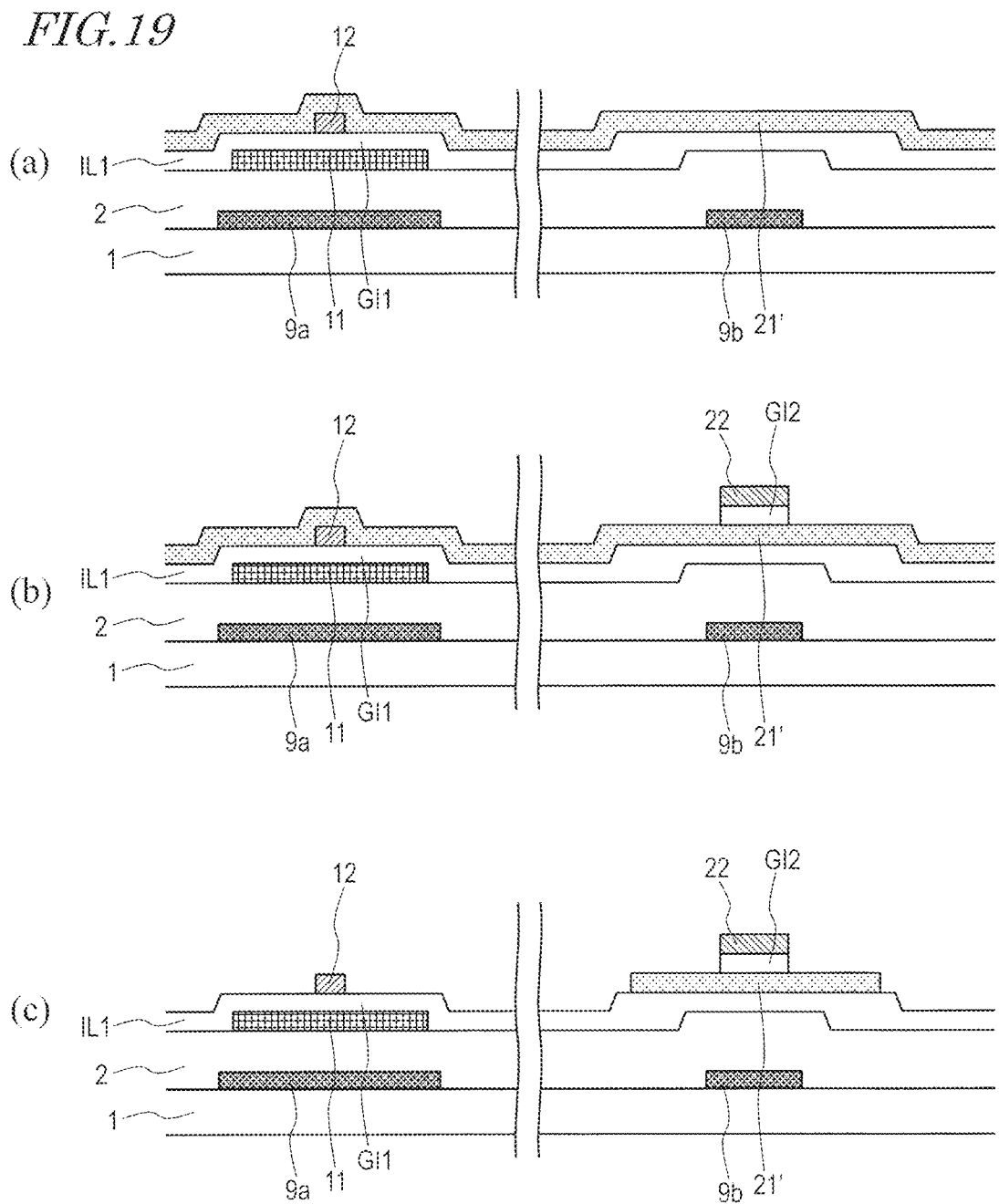
FIG. 19(a) through (c) are step-by-step cross-sectional views for describing a method of producing the active matrix substrate 200.

The above description has illustrated an example where the oxide semiconductor film is patterned before formation of the second gate insulating layer GI2 and the second gate electrode 22; however, as shown in FIG. 19, the oxide semiconductor film may be patterned after formation of the second gate insulating layer GI2 and the second gate electrode 22.

Specifically, first, as shown in FIG. 19(a), an oxide semiconductor film 21' is deposited on the first insulating layer IL1. Next, as shown in FIG. 19(b), the second gate insulating layer GI2 and the second gate electrode 22 are formed on the oxide semiconductor film 21'. Thereafter, as shown in FIG. 19(c), the oxide semiconductor film 21' is patterned to form the oxide semiconductor layer 21.

As is described with reference to FIGS. 19(a) through (c), in the case where the oxide semiconductor film 21' is patterned after formation of the second gate insulating layer GI2 and the second gate electrode 22, the oxide semiconductor film 21' functions as an etch stopper during etching of the insulating film to become the second gate insulating layer GI2, whereby the first insulating layer IL1 can be prevented from becoming overetched.

Embodiment 4

Figure 20:
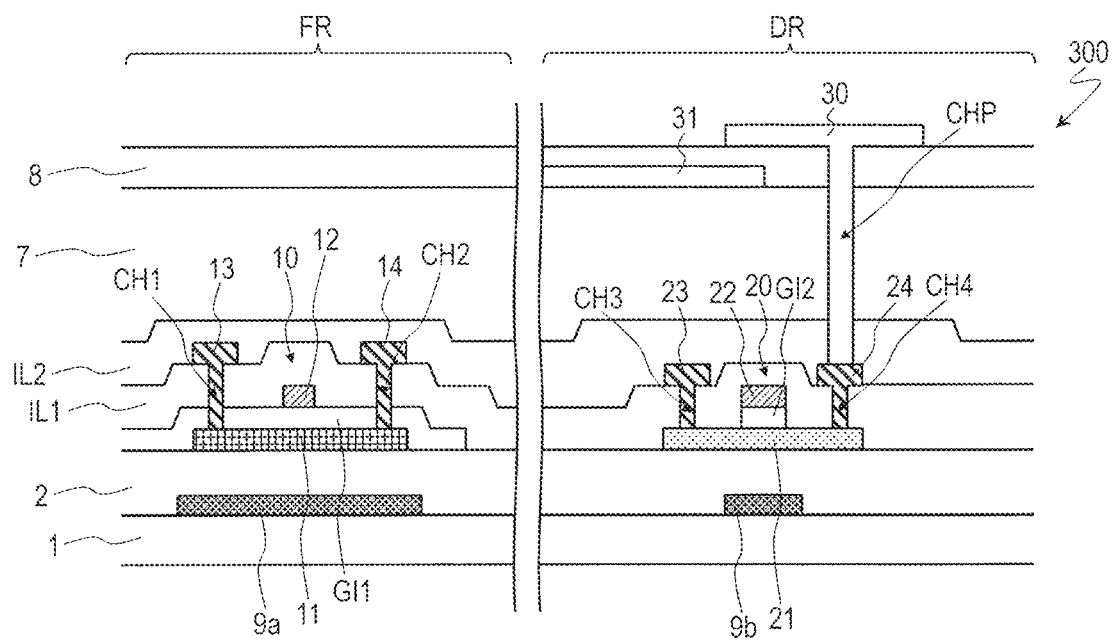
FIG. 20 A cross-sectional view schematically showing an active matrix substrate 300 according to an embodiment of the present invention.

With reference to FIG. 20, an active matrix substrate 300 according to the present embodiment will be described. FIG. 20 is a cross-sectional view schematically showing the active matrix substrate 300.

The active matrix substrate 300 according to the present embodiment differs from the active matrix substrates 100 and 200 according to Embodiments 2 and 3 with respect to the number of insulating layers being stacked. As will be described later, the active matrix substrate 300 according to the present embodiment includes a first gate insulating layer GI1, a second gate insulating layer GI2, a first insulating layer IL1, and a second insulating layer IL2, between a basecoat layer 2 and a planarization layer 7. However, since the first gate insulating layer GI1 and the second gate insulating layer GI2 are made of the same insulating film, the number of insulating layers being stacked between the basecoat layer 2 and the planarization layer 7 is three. Moreover, in the present embodiment, the first gate electrode 12 and the second gate electrode 22 are formed from the same electrically conductive film (i.e., simultaneously through patterning of the same electrically conductive film).

As shown in FIG. 20, the active matrix substrate 300 includes a first TFT 10 which is a circuit TFT disposed in a peripheral region FR and a second TFT 20 which is a pixel TFT disposed in a displaying region DR.

The first TFT 10 is a crystalline silicon TFT that includes a crystalline silicon semiconductor layer 11 as an active layer. In addition to the crystalline silicon semiconductor layer 11, the first TFT 10 includes a first gate insulating layer GI1, a first gate electrode 12, a first source electrode 13, and a first drain electrode 14.

The crystalline silicon semiconductor layer 11 is disposed on the basecoat layer 2. The first gate insulating layer GI1 is disposed on the crystalline silicon semiconductor layer 11.

The first gate electrode 12 is disposed on the first gate insulating layer GI1. The first gate electrode 12 is opposed to the crystalline silicon semiconductor layer 11 via the first gate insulating layer GI1.

The first source electrode 13 and the first drain electrode 14 are electrically connected to the crystalline silicon semiconductor layer 11. In the present embodiment, a first insulating layer IL1 that includes a portion covering the first gate insulating layer GI1 and the first gate electrode 12 is provided, such that the first source electrode 13 and the first drain electrode 14 are disposed on the first insulating layer IL1. The first source electrode 13 and the first drain electrode 14 are connected to the crystalline silicon semiconductor layer 11 within a first contact hole CH1 and a second contact hole CH2, respectively, which are made in the first insulating layer IL1 and the first gate insulating layer GI1.

The second TFT 20 is an oxide semiconductor TFT that includes an oxide semiconductor layer 21 as an active layer. In addition to the oxide semiconductor layer 21, the second TFT 20 includes a second gate insulating layer GI2, a second gate electrode 22, a second source electrode 23, and a second drain electrode 24.

The oxide semiconductor layer 21 is disposed on the basecoat layer 2. The second gate insulating layer GI2 is disposed on the oxide semiconductor layer 21. The second gate insulating layer GI2 is formed in the shape of an island, exclusively in a region that overlaps the second gate electrode 22.

The second gate electrode 22 is disposed on the second gate insulating layer GI2. The second gate electrode 22 is opposed to the oxide semiconductor layer 21 via the second gate insulating layer GI2. Although not shown, the second gate electrode 22 has a multilayer structure similar to that of the upper gate electrode 112 described above with reference to FIG. 1.

The second source electrode 23 and the second drain electrode 24 are electrically connected to the oxide semiconductor layer 21. The first insulating layer IL1 includes a portion that covers the oxide semiconductor layer 21, the second gate insulating layer GI2, and the second gate electrode 22, such that the second source electrode 23 and the second drain electrode 24 are disposed on the first insulating layer IL1. The second source electrode 23 and the second drain electrode 24 are connected to the oxide semiconductor layer 21 within a third contact hole CH3 and a fourth contact hole CH4, respectively, which are made in the first insulating layer IL1. As viewed from the normal direction of the substrate 101, each of the second source electrode 23 and the second drain electrode 24 does not overlap the second gate electrode 22.

On the first insulating layer IL1, the second insulating layer IL2 is disposed so as to cover the first source electrode 13, the first drain electrode 14, the second source electrode 23, and the second drain electrode 24.

As described earlier, each of the first TFT 10 and the second TFT 20 has a top gate structure.

The planarization layer 7 is disposed on the second insulating layer IL2, and a common electrode 31 is provided on the planarization layer 7. A dielectric layer 8 is provided so as to cover the common electrode 31, such that the pixel electrode 30 is disposed on the dielectric layer 8. The pixel electrode 30 is connected to the second drain electrode 24 within a pixel contact hole CHP which is made in the second insulating layer IL2, the planarization layer 7, and the dielectric layer 8.

Below the crystalline silicon semiconductor layer 11, a first light shielding layer 9a is provided so as to overlap the crystalline silicon semiconductor layer 11 as viewed from the normal direction of the substrate 101. Below the oxide semiconductor layer 21, a second light shielding layer 9b is provided so as to overlap the oxide semiconductor layer 21 as viewed from the normal direction of the substrate 101.

In the active matrix substrate 300 according to the present embodiment, too, since each of the first TFT 10 and the second TFT 20 has a top gate structure, current drivability of the pixel TFT (second TFT 20) can be improved without degrading the reliability of the circuit TFTs (first TFTs 10) or deteriorating the display quality, as is the case with the active matrix substrates 100 and 200 according to Embodiments 2 and 3.

Moreover, the active matrix substrate 300 according to the present embodiment has even fewer insulating layers being stacked than in the active matrix substrate 200 according to Embodiment 3. Thus, the number of production steps can be further reduced, whereby the production cost can be further decreased.

Similarly to the active matrix substrate 100 according to Embodiment 2, in the active matrix substrate 300 according to the present embodiment, too, the second light shielding layer 9b may be electrically connected to the second gate electrode 22 in the case where the second light shielding layer 9b is made of an electrically conductive material. This will allow the second light shielding layer 9b to function as a further gate electrode (backgate electrode) of the second TFT 20. Thus, the ON current of the second TFT 20 can be further increased and the current drivability can be further improved.

Figure 21:
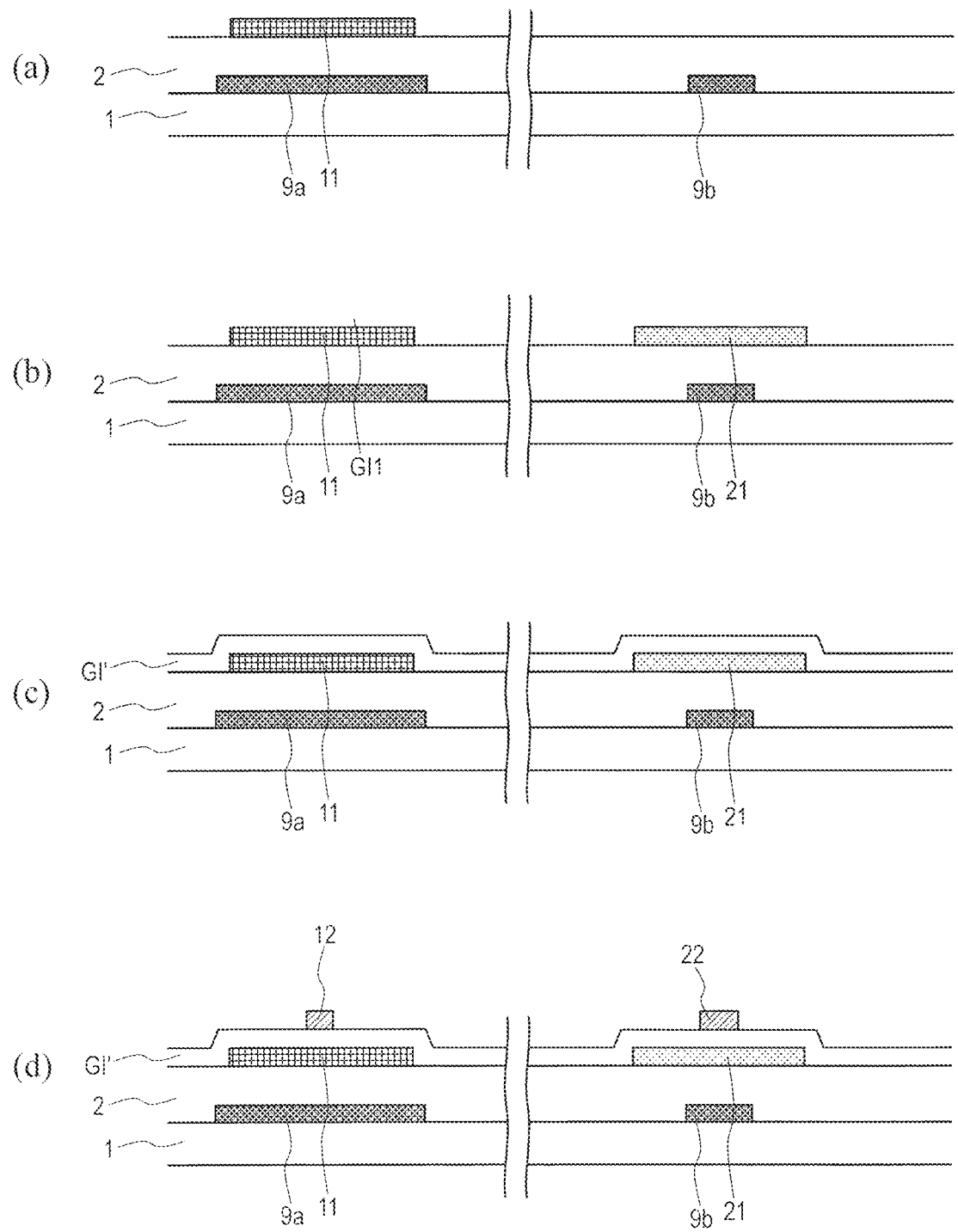
FIG. 21(a) through (d) are step-by-step cross-sectional views for describing a method of producing the active matrix substrate 300.
Figure 22:
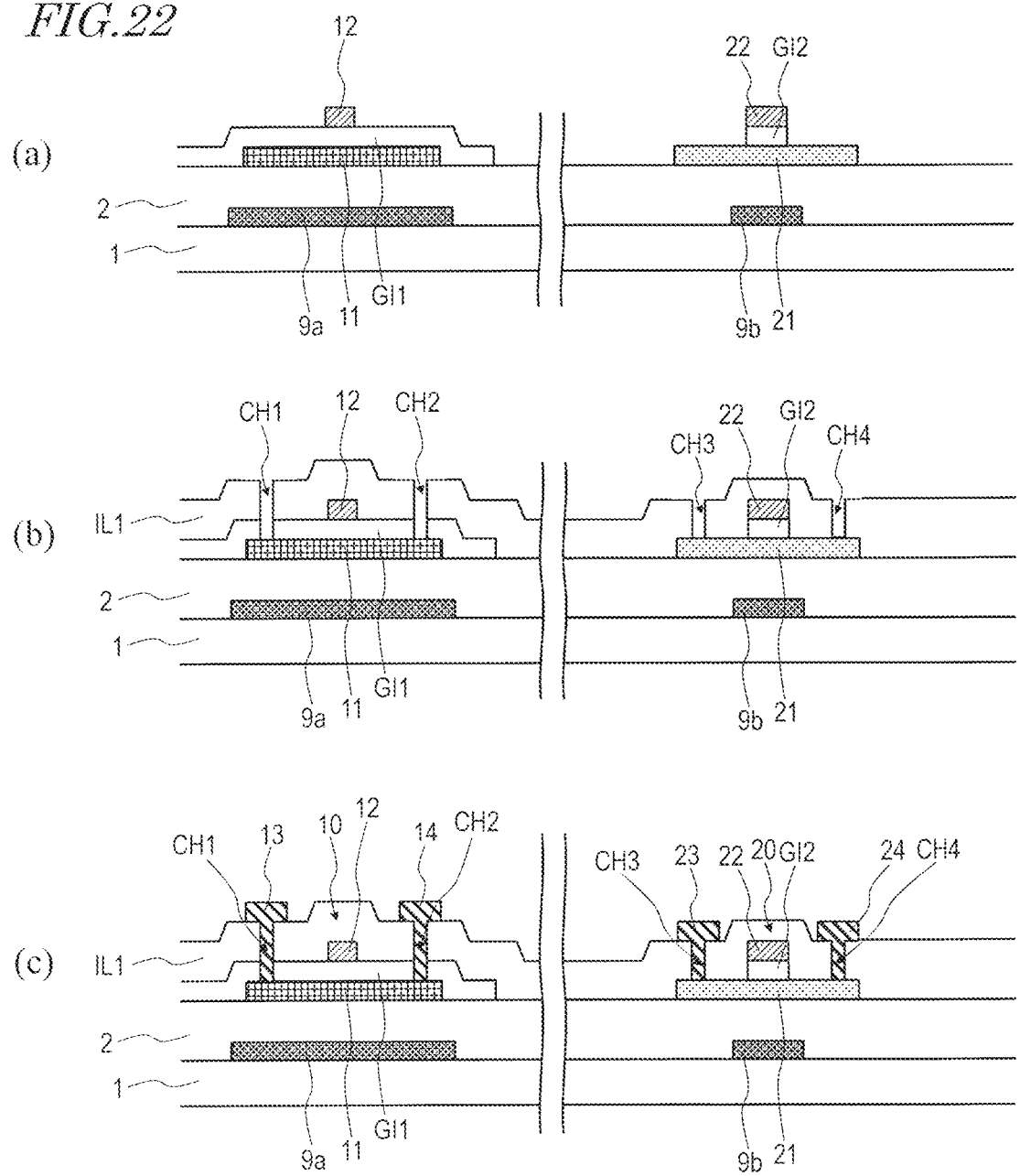
FIG. 22(a) through (c) are step-by-step cross-sectional views for describing a method of producing the active matrix substrate 300.
Figure 23:
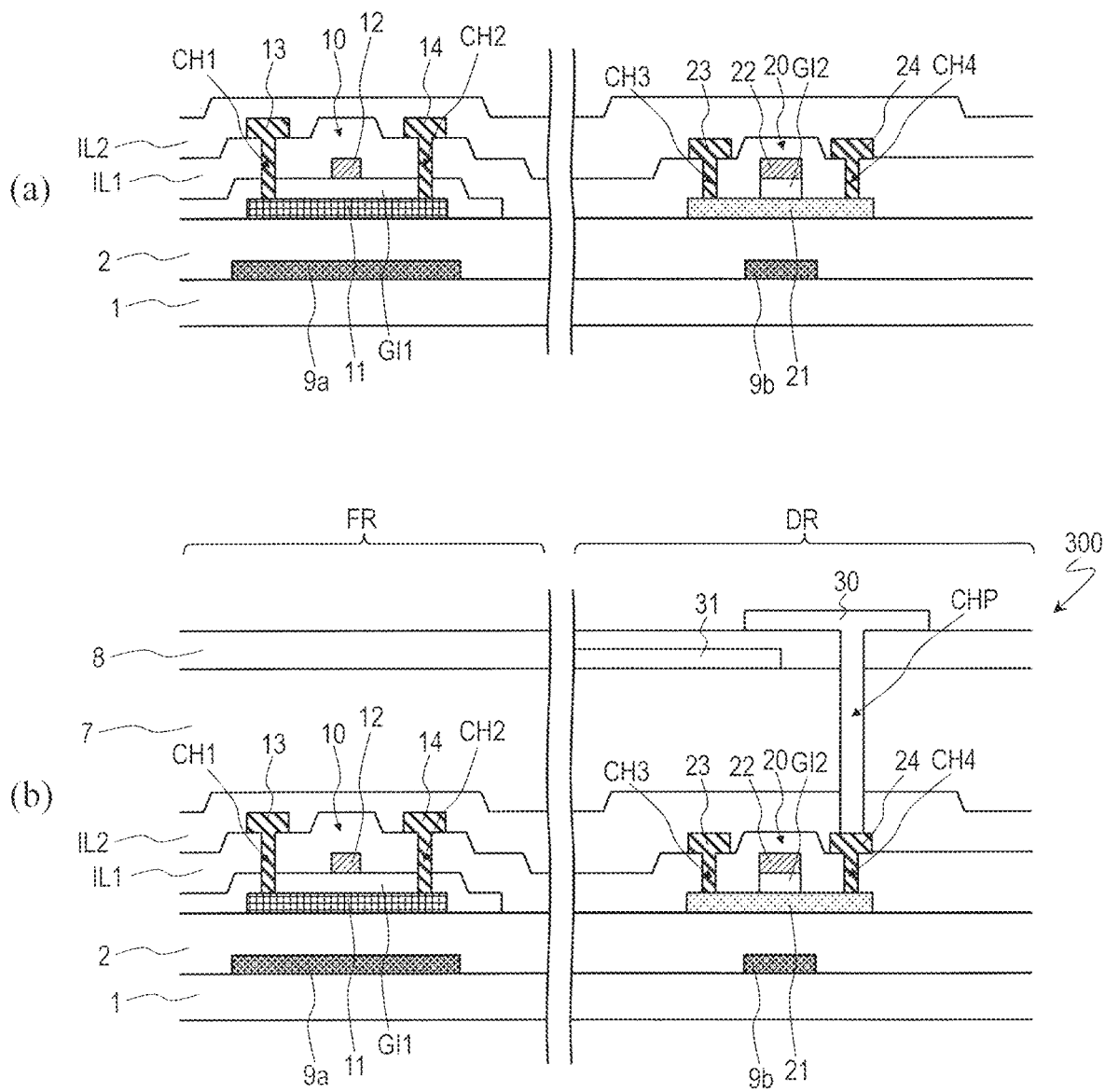
FIGS. 23(a) and (b) are step-by-step cross-sectional views for describing a method of producing the active matrix substrate 300.

Now, an exemplary method of producing the active matrix substrate 300 will be described. FIG. 21 to FIG. 23 are step-by-step cross-sectional views for describing a method of producing the active matrix substrate 300.

First, as shown in FIG. 21(a), a first light shielding layer 9a, a second light shielding layer 9b, a basecoat layer 2, and a crystalline silicon semiconductor layer 11 are sequentially formed on a substrate 1. These steps can be performed similarly to the steps which have been described in connection with the active matrix substrate 100 according to Embodiment 2 with reference to FIG. 11(a) through FIG. 11(c).

Next, as shown in FIG. 21(b), an oxide semiconductor layer 21 is formed on the basecoat layer 2. Specifically, after an oxide semiconductor film is deposited on the basecoat layer 2, the oxide semiconductor film may be patterned to form the oxide semiconductor layer 21. The thickness of the oxide semiconductor layer 21 may be e.g. not less than 10 nm and not more than 150 nm.

Then, as shown in FIG. 21(c), an insulating film GI' to become a first gate insulating layer GI1 and a second gate insulating layer GI2 is formed so as to cover the basecoat layer 2, the crystalline silicon semiconductor layer 11, and the oxide semiconductor layer 21. The insulating film GI' may be a silicon oxide (SiOx) film, for example. The thickness of the insulating film GI' may be e.g. from not less than 90 nm to 200 nm.

Thereafter, as shown in FIG. 21(d), on the insulating film GI', a first gate electrode 12 is formed so as to be opposed to the crystalline silicon semiconductor layer 11 via the insulating film GI', and a second gate electrode 22 is formed so as to be opposed to the oxide semiconductor layer 21 via the insulating film GI'. Specifically, after an electrically conductive film for the gate is deposited on the insulating film GI', the electrically conductive film for the gate may be patterned by using a first resist mask to form the first gate electrode 12 and the second gate electrode 22. The (multilayer film) material of the electrically conductive film for the gate may be the same material as that of the aforementioned second electrically conductive film 112'. The thicknesses of the first gate electrode 12 and the second gate electrode 22 may be e.g. not less than 30 nm and not more than 500 nm.

Next, by using the first gate electrode 12 as a mask, an impurity is implanted in the crystalline silicon semiconductor layer 11 to form a source region and a drain region. The region of the crystalline silicon semiconductor layer 11 where the impurity was not implanted becomes a channel region (active region).

Then, as shown in FIG. 22(a), the insulating film GI' may be patterned to form the first gate insulating layer GI1 and the second gate insulating layer GI2. Herein, a second resist mask for forming the first gate insulating layer GI1 is further provided, and this second resist mask is used to pattern the first gate insulating layer GI1. Patterning of the second gate insulating layer GI2 is performed by using the gate electrode 22 as a mask.

Thereafter, as shown in FIG. 22(b), a first insulating layer IL1 is formed so as to cover the first gate electrode 12, the second gate electrode 22, the oxide semiconductor layer 21, and the like. The first insulating layer IL1 may be a silicon oxide (SiOx) layer, a silicon nitride (SiNx) layer, or a silicon oxynitride (SiNxOy) layer, for example. Moreover, the first insulating layer IL1 may have a multilayer structure in which such layers are stacked. The thickness of the first insulating layer IL1 may be e.g. not less than 150 nm and not more than 500 nm. Thereafter, a first contact hole CH1 and a second contact hole CH2 are made in the first insulating layer IL1 and the first gate insulating layer GI1 so that parts (a source region and a drain region) of the crystalline silicon semiconductor layer 11 will be exposed. Moreover, a third contact hole CH3 and a fourth contact hole CH4 are made in the first insulating layer IL1 so that parts (a source contact region and a drain contact region) of the oxide semiconductor layer 21 will be exposed.

Next, as shown in FIG. 22(c), a first source electrode 13, a first drain electrode 14, a second source electrode 23, and a second drain electrode 24 are formed on the first insulating layer IL1. Specifically, after an electrically conductive film for the source/drain is deposited on the first insulating layer ILL the electrically conductive film for the source/drain may be patterned to form the first source electrode 13, the first drain electrode 14, the second source electrode 23, and the second drain electrode 24. As the material of the electrically conductive film for the source/drain, for example, metals such as molybdenum (Mo), tungsten (W), aluminum (Al), copper (Cu), titanium (Ti), and tantalum (Ta), or an alloy thereof, can be used. The thicknesses of the first source electrode 13, the first drain electrode 14, the second source electrode 23, and the second drain electrode 24 may be e.g. not less than 100 nm and not more than 500 nm.

Then, as shown in FIG. 23(a), a second insulating layer IL2 that covers the first insulating layer IL1, the first source electrode 13, the first drain electrode 14, the second source electrode 23, and the second drain electrode 24 is formed. The second insulating layer IL2 may be a silicon nitride (SiNx) layer, for example. The thickness of the second insulating layer IL2 may be e.g. not less than 100 nm and not more than 500 nm.

Thereafter, as shown in FIG. 23(b), a planarization layer 7, a common electrode 31, a dielectric layer 8, and a pixel electrode 30 are sequentially formed on the second insulating layer IL2. These steps can be performed similarly to the steps which have been described in connection with the active matrix substrate 100 according to Embodiment 2 with reference to FIG. 14(a) through FIG. 15(b). In this manner, the active matrix substrate 300 can be obtained.

Note that, without being limited to liquid crystal display devices, the active matrix substrates according to Embodiments 2 to 4 are suitably applicable to organic ELs (electroluminescence) display devices of bottom-emission type.

(Regarding the Oxide Semiconductor)

The oxide semiconductor that is contained in the oxide semiconductor layer 107, 21 may be an amorphous oxide semiconductor film, or a crystalline oxide semiconductor having a crystalline portion(s). Examples of crystalline oxide semiconductors may include polycrystalline oxide semiconductors, microcrystalline oxide semiconductors, and crystalline oxide semiconductors whose c axis is oriented substantially perpendicular to the layer plane.

As has already been described, in the case where the second light shielding layer 9b is allowed to function as a backgate electrode of the second TFT 20, it is preferable that the oxide semiconductor layer 21 does not have a multilayer structure (i.e., be a single layer).

In the case where the second light shielding layer 9b is not allowed to function as a backgate electrode of the second TFT 20 (i.e., when the second light shielding layer 9b is not electrically connected to the second gate electrode 22), the oxide semiconductor layer 21 may have a multilayer structure with two or more layers. When the oxide semiconductor layer 21 has a multilayer structure, the oxide semiconductor layer 21 may include an amorphous oxide semiconductor layer and a crystalline oxide semiconductor layer; a plurality of crystalline oxide semiconductor layers with different crystal structures may be included; or a plurality of amorphous oxide semiconductor layers may be included. In the case where the oxide semiconductor layer 21 has a two-layer structure including an upper layer and a lower layer, it is preferable that the oxide semiconductor that is contained in the upper layer has an energy gap which is greater than the energy gap of the oxide semiconductor that is contained in the lower layer. However, when the difference between the energy gaps of these layers is relatively small, the energy gap of the oxide semiconductor of the lower layer may be greater than the energy gap of the oxide semiconductor of the upper layer.

Materials, structures, film formation methods, and the like of amorphous oxide semiconductors and the aforementioned crystalline oxide semiconductors, the construction of an oxide semiconductor layer having a multilayer structure, and the like are described in Japanese Laid-Open Patent Publication No. 2014-007399, for example. The entire disclosure of Japanese Laid-Open Patent Publication No. 2014-007399 is incorporated herein by reference.

The oxide semiconductor layer 107, 21 may contain at least one metallic element among In, Ga, and Zn, for example. In an embodiment of the present invention, the oxide semiconductor layer 107, 21 contains an In—Ga—Zn—O based semiconductor (e.g., indium gallium zinc oxide), for example. Herein, the In—Ga—Zn—O based semiconductor is a ternary oxide of In (indium), Ga (gallium), and Zn (zinc). The ratio between In, Ga, and Zn (composition ratio) is not particularly limited, and includes In:Ga:Zn=2:2:1, In:Ga:Zn=1:1:1, In:Ga:Zn=1:1:2, and the like, for example. Such an oxide semiconductor layer 21 may be made of an oxide semiconductor film containing an In—Ga—Zn—O based semiconductor.

The In—Ga—Zn—O based semiconductor may be amorphous or crystalline. As a crystalline In—Ga—Zn—O based semiconductor, a crystalline In—Ga—Zn—O based semiconductor whose c axis is oriented generally perpendicular to the layer plane is preferable.

Note that the crystal structure of a crystalline In—Ga—Zn—O based semiconductor is disclosed in, for example, Japanese Laid-Open Patent Publication No. 2014-007399, supra, Japanese Laid-Open Patent Publication No. 2012-134475, Japanese Laid-Open Patent Publication No. 2014-209727, and so on. The entire disclosure of Japanese Laid-Open Patent Publication No. 2012-134475 and Japanese Laid-Open Patent Publication No. 2014-209727 is incorporated herein by reference. A TFT having an In—Ga—Zn—O based semiconductor layer has a high mobility (more than 20 times that of an a-Si TFT) and a low leak current (less than 1/100 of that of an a-Si TFT), and is suitably used as a driving TFT (e.g., a TFT that is included in a driving circuit which is provided around a displaying region that includes a plurality of pixels and on the same substrate as the displaying region) or a pixel TFT (a TFT which is provided in a pixel).

The oxide semiconductor layer 107, 21 may contain other oxide semiconductors instead of an In—Ga—Zn—O based semiconductor. For example, it may contain an In—Sn—Zn—O based semiconductor (e.g., $In_2O_3$—$SnO_2$—ZnO; InSnZnO). An In—Sn—Zn—O based semiconductor is a ternary oxide of In (indium), Sn (tin), and Zn (zinc). Alternatively, the oxide semiconductor layer 21 may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, or the like. Note that, irrespective of the kind of oxide semiconductor, the oxide semiconductor is increased in resistance with the admixing of a metallic element such as Cu, Mo, or Cr.

(Peripheral Circuitry)

Figure 24:
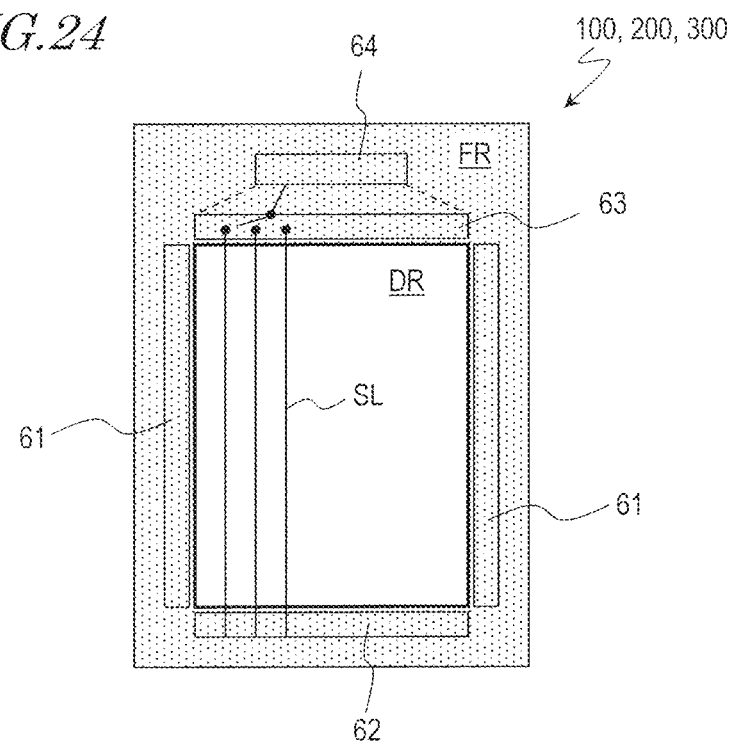
FIG. 24 A plan view illustrating exemplary peripheral circuitry that is included in the active matrix substrates 100, 200, and 300.

With reference to FIG. 24, an example of peripheral circuitry to be provided in the peripheral region FR will be described.

In the example shown in FIG. 24, gate driver circuits 61, a check circuit 62, and a source switching (SSD) circuit 63 are provided in the peripheral region FR. Gate bus lines, not shown, are connected to terminals of the gate driver circuits. Source bus lines SL are connected to terminals of a driver IC 64 of the source driver, via the SSD circuit 63. The SSD circuit 63 allows video data from a single video signal line that is connected to each terminal of the driver IC 64 to be split into a plurality of (e.g., three herein) source bus lines SL.

The first TFTs 10 that are included in the active matrix substrates 100, 200, and 300 according to embodiments of the present invention may compose the gate driver circuits 61, the check circuit 62 and/or the source switching (SSD) circuit 63.

(Display Device)

An active matrix substrate according to an embodiment of the present invention is suitably used in a display device, and may be suitably used in a liquid crystal display device or an organic EL display device, for example. A liquid crystal display device may include an active matrix substrate according to an embodiment of the present invention, a counter substrate that is opposed to the active matrix substrate, and a liquid crystal layer that is provided between the active matrix substrate and the counter substrate. Although an active matrix substrate for a liquid crystal display device of the FFS mode has been described above as an example, active matrix substrates according to embodiments of the present invention ca be used in liquid crystal display devices of various display modes. Active matrix substrates according to embodiments of the present invention can also be used in liquid crystal display devices of a lateral field mode other than FFS (e.g., IPS mode) or liquid crystal display devices of a vertical field mode (e.g., TN mode or vertical alignment mode). Moreover, an organic EL display device may include an active matrix substrate according to an embodiment of the present invention, an organic layer provided on pixel electrodes, and a common electrode provided on the organic layer.

INDUSTRIAL APPLICABILITY

Active matrix substrates according to embodiments of the present invention can be suitably used in various display devices, such as liquid crystal display devices.

REFERENCE SIGNS LIST

101: substrate
103: lower gate electrode
105: lower insulating layer 107: oxide semiconductor layer
107s: source contact region
107d: drain contact region
107r: exposed portion
109: upper insulating layer
111: interlayer insulating layer
112: upper gate electrode
112L: alloy layer
112U: metal layer
113: source electrode
114: drain electrode
201, 202, 203, 204, 205: oxide semiconductor TFT
CHd: drain aperture
CHs: source aperture
R: resist layer
bm: barrier metal layer
p1: first portion of oxide semiconductor layer
p2: second portion of oxide semiconductor layer
rc: channel region
rf: offset region
1 substrate
2 basecoat layer
6 color filter layer
7 planarization layer
8 dielectric layer
9a first light shielding layer
9b second light shielding layer
10 first TFT
11 crystalline silicon semiconductor layer
12 first gate electrode
13 first source electrode
14 first drain electrode
20 second TFT
21 oxide semiconductor layer
22 second gate electrode
23 second source electrode
24 second drain electrode
30 pixel electrode
30a slit
31 common electrode
61 gate driver circuit
62 check circuit
63 source switching circuit
64 driver IC
100, 200, 300 active matrix substrate
CH1 first contact hole
CH2 second contact hole
CH3 third contact hole
CH4 fourth contact hole
CHP pixel contact hole
GI1 first gate insulating layer
GI2 second gate insulating layer
IL1 first insulating layer
IL2 second insulating layer
IL3 third insulating layer
IL4 fourth insulating layer
GL gate bus lines
GL1 first gate bus line
GL2 second gate bus line
SL source bus line
DR displaying region
FR peripheral region
P pixel region

The invention claimed is:

1. A method of producing an active matrix substrate including an oxide semiconductor TFT, the method comprising:

a step of forming an oxide semiconductor layer including oxide semiconductor on a substrate;

a step of forming a gate insulating layer so as to cover the oxide semiconductor layer;

a step of forming a film of alloy containing a first metallic element M on the gate insulating layer so as to be in contact with an upper face of the gate insulating layer, and thereafter forming a metal film made of the first metallic element M on the alloy film, to form an electrically conductive film for the gate that includes the alloy film and the metal film;

a step of forming a resist layer on a part of the electrically conductive film for the gate, and patterning the electrically conductive film for the gate by using the resist layer as a mask, to form an upper gate electrode and to admix a part of the first metallic element M in the metal film into a first portion of the oxide semiconductor layer beyond the alloy film and the gate insulating layer, the first portion being a portion of the oxide semiconductor layer that overlaps the upper gate electrode as viewed from a normal direction of the substrate;

a step of etching the gate insulating layer, by using the resist layer and the upper gate electrode as a mask, to expose a part of the oxide semiconductor layer;

a step of removing the resist layer from the upper gate electrode by using a resist stripper and allowing the resist stripper to be in contact with the upper gate electrode and an exposed portion of the oxide semiconductor layer, to admix the first metallic element M being dissolved in the resist stripper into the oxide semiconductor layer; and a step of forming an interlayer insulating layer that covers the oxide semiconductor layer, the gate insulating layer, and the upper gate electrode, wherein the first metallic element M is Cu, Mo or Cr, and the metal film is Cu film, Mo film, or Cr film.

2. The method of producing an active matrix substrate of claim 1, the method further comprising:

a step of forming a source electrode and a drain electrode on the interlayer insulating layer, the source electrode being in contact with a source contact region of the oxide semiconductor layer and the drain electrode being in contact with a drain contact region of the oxide semiconductor layer, wherein a second portion of the oxide semiconductor layer is directly in contact with the interlayer insulating layer, the second portion being located between the first portion and the source contact region or between the first portion and the drain contact region, as viewed from the normal direction of the substrate.

3. The method of producing an active matrix substrate of claim 1, wherein the first portion and the exposed portion of the oxide semiconductor layer contain the first metallic element M at a concentration of more than 0 atom % but not more than 0.5 atom % with respect to the oxide semiconductor.

4. The method of producing an active matrix substrate of claim 1, wherein:

the alloy film further contains a second metallic element X;

the first metallic element M is Cu; and the second metallic element X is Mg, Al, Ca, Mo, Mn, or Zr.

5. The method of producing an active matrix substrate of claim 1, wherein the alloy film contains the first metallic element M in an amount of more than 50 weight %.

6. The method of producing an active matrix substrate of claim 1, wherein the gate insulating layer has a thickness of not less than 90 nm and not more than 200 nm.

7. The method of producing an active matrix substrate of claim 1, wherein the oxide semiconductor layer has a multilayer structure.

8. The method of producing an active matrix substrate of claim 1, wherein the oxide semiconductor layer comprises an In—Ga—Zn—O based semiconductor.

9. The method of producing an active matrix substrate of claim 8, wherein the oxide semiconductor layer includes a crystalline portion.

* * * * *